United States Patent [19]
Kuroda

[11] Patent Number: 5,684,416
[45] Date of Patent: Nov. 4, 1997

[54] LOW VOLTAGE BIPOLAR TRANSISTOR LOGIC CIRCUIT

[75] Inventor: Tadahiro Kuroda, Yokohama, Japan

[73] Assignee: Kabushiki Kaisha Toshiba, Tokyo, Japan

[21] Appl. No.: 424,734

[22] Filed: Apr. 18, 1995

[30] Foreign Application Priority Data

Apr. 18, 1994 [JP] Japan .................................. 6-078940

[51] Int. Cl.$^6$ .................................. H03K 19/086
[52] U.S. Cl. .................................. 326/126; 326/75
[58] Field of Search .................................. 326/124, 126, 326/127, 75, 90, 84

[56] References Cited

U.S. PATENT DOCUMENTS

| | | | |
|---|---|---|---|
| 4,516,039 | 5/1985 | Matsuzaki et al. | 326/127 |
| 4,647,799 | 3/1987 | Hsu et al. | 326/126 |
| 4,737,663 | 4/1988 | Varadarajan | 326/126 |
| 4,737,664 | 4/1988 | Wilheim | 326/75 |
| 4,751,404 | 6/1988 | Yuen | 326/126 |
| 4,857,771 | 8/1989 | Ovens et al. | 326/126 |
| 4,868,423 | 9/1989 | Abdi | 326/127 |
| 5,113,095 | 5/1992 | Huehne | 326/127 |
| 5,250,860 | 10/1993 | Chu | 326/75 |
| 5,293,083 | 3/1994 | Askin et al. | 326/126 |

*Primary Examiner*—Edward Westin
*Assistant Examiner*—Benjamin D. Driscoll
*Attorney, Agent, or Firm*—Loeb & Loeb LLP

[57] ABSTRACT

A semiconductor integrated circuit device has a differential logic circuit formed by multi-stage series-gating logic circuits each composed of bipolar transistors whose emitters are connected in common and level shift circuits each for shifting a level of an input signal that is inputted from the outside in correspondence to one of the stage logic circuits of the differential logic circuit, and for supplying the level-shifted input signal to the base of one of the bipolar transistors of the corresponding logic circuit. In particular, a potential difference between the level-shifted signals inputted to the bases of the bipolar transistors of each of the stage logic circuits is determined, as a level shift rate, to be lower than a built-in potential between the base and emitter of each of the bipolar transistors thereof. The semiconductor integrated circuit device is operative on a lower supply voltage, without significantly degrading the functions and performance thereof.

13 Claims, 30 Drawing Sheets

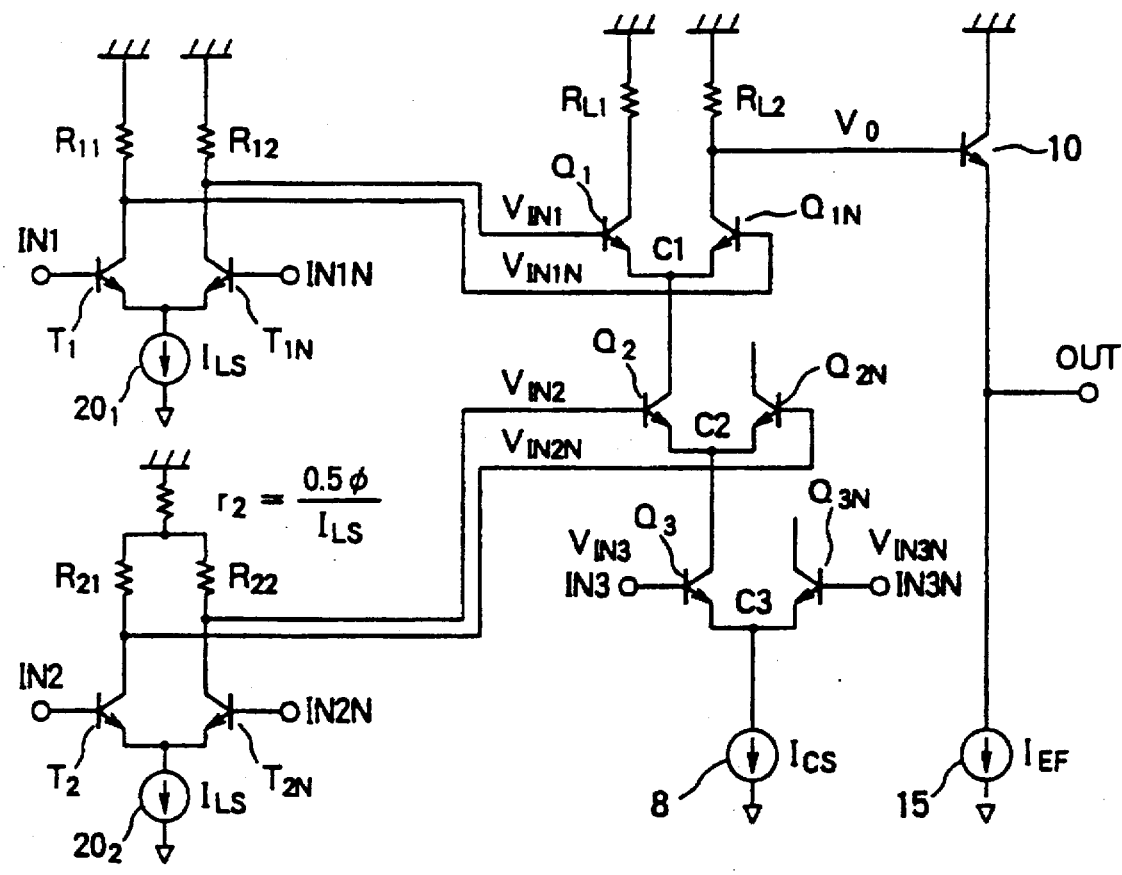
F I G. 7

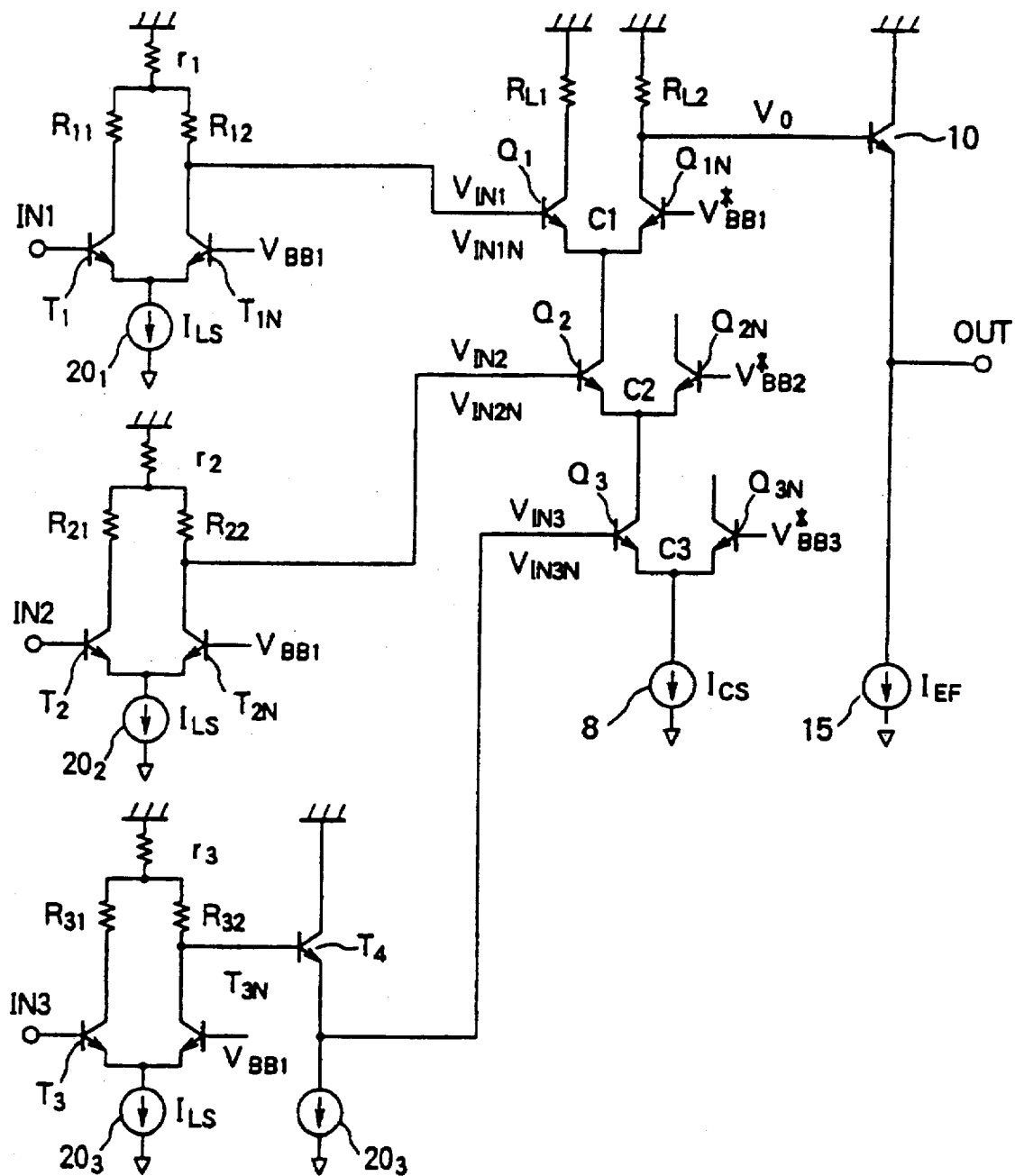
F I G. 17

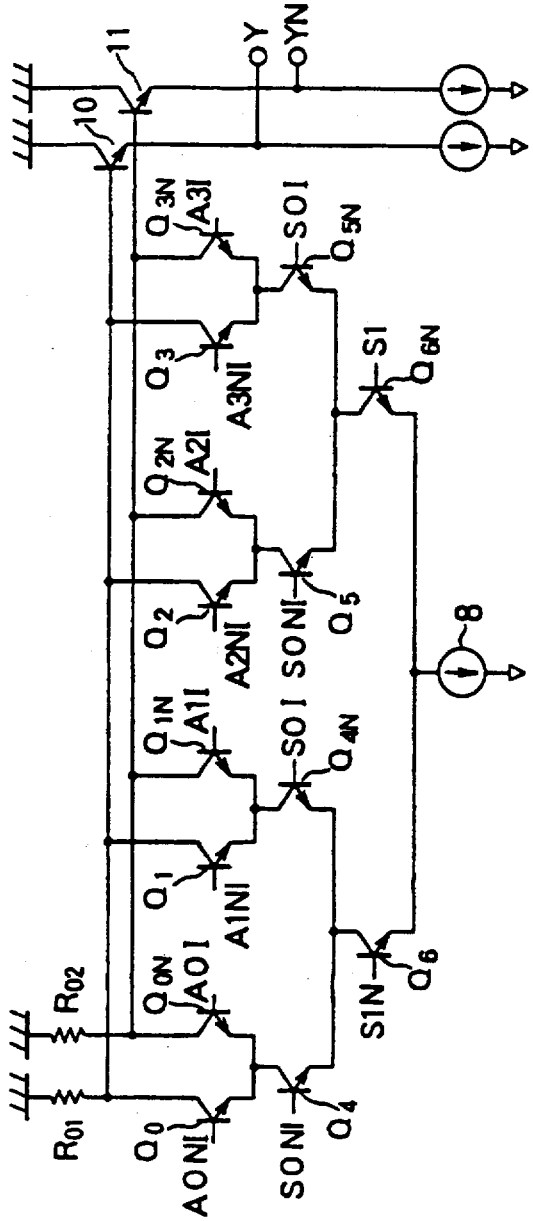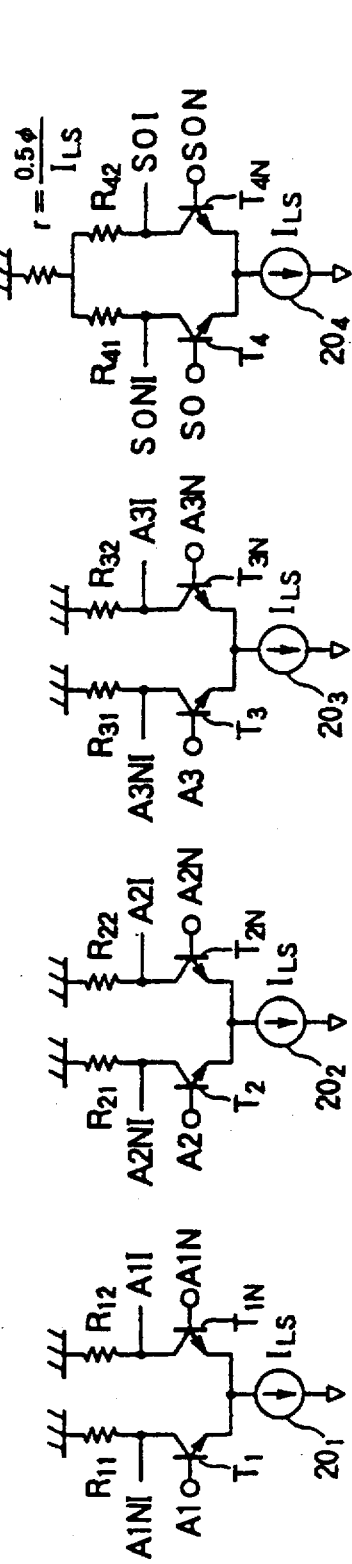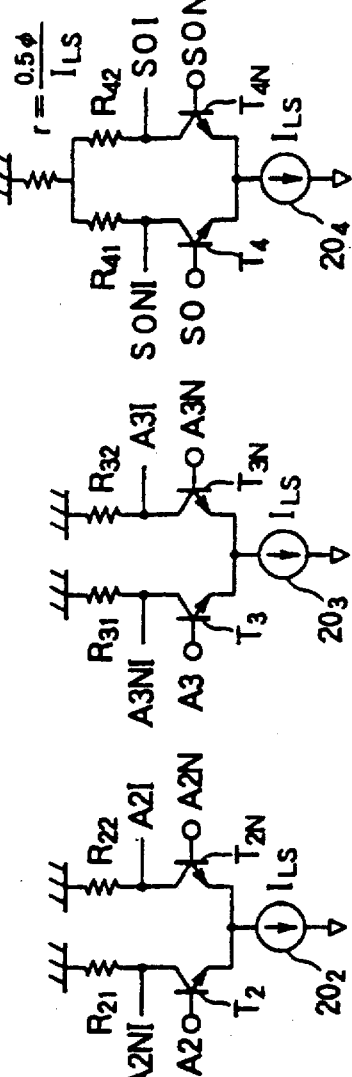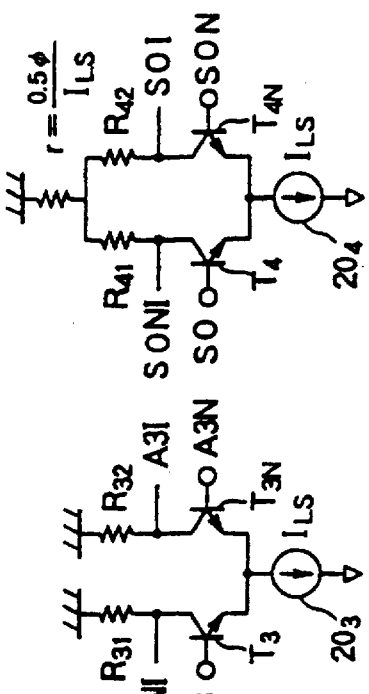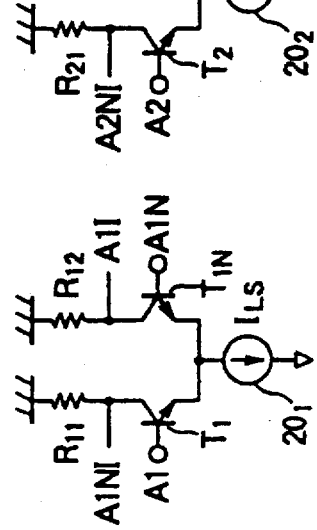
FIG. 25A FIG. 25B FIG. 25C FIG. 25D FIG. 25E FIG. 25F

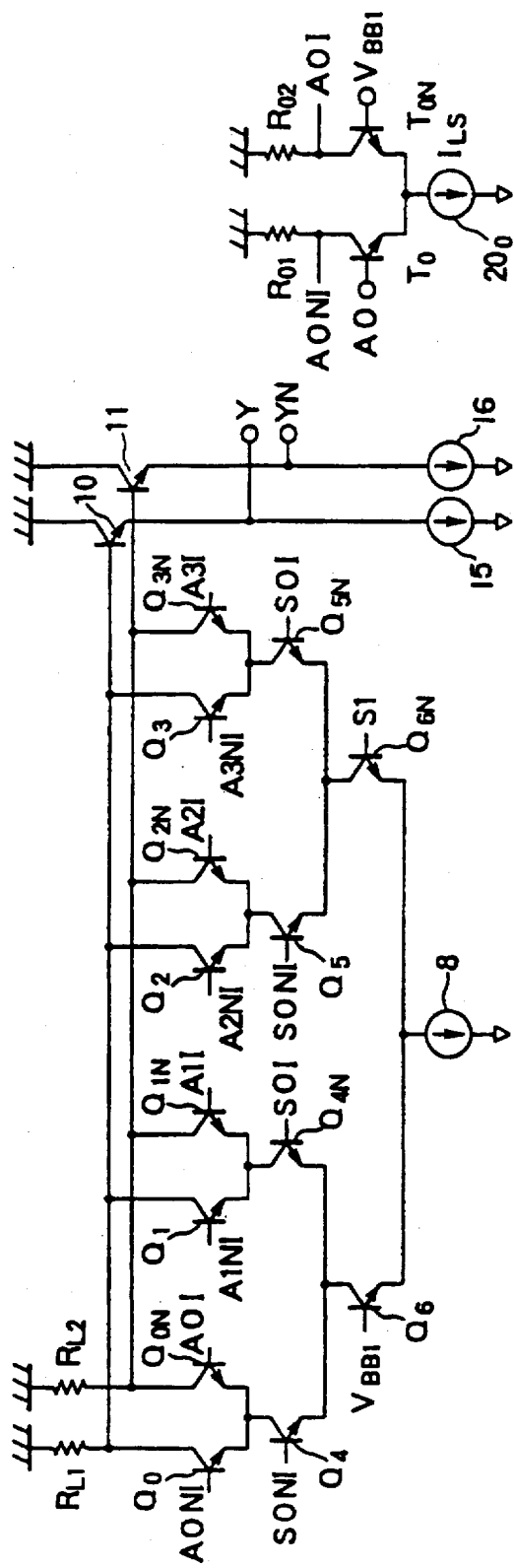
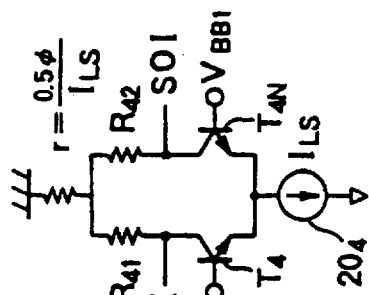
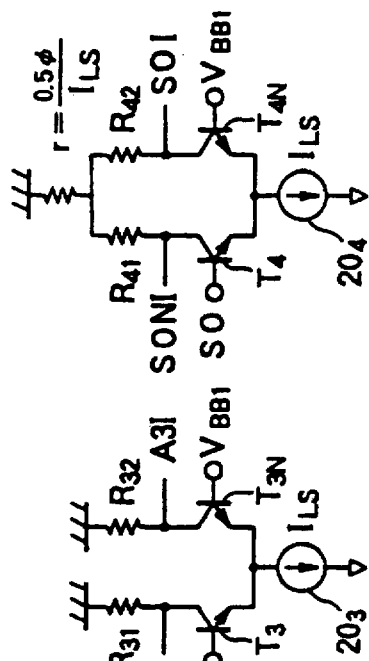
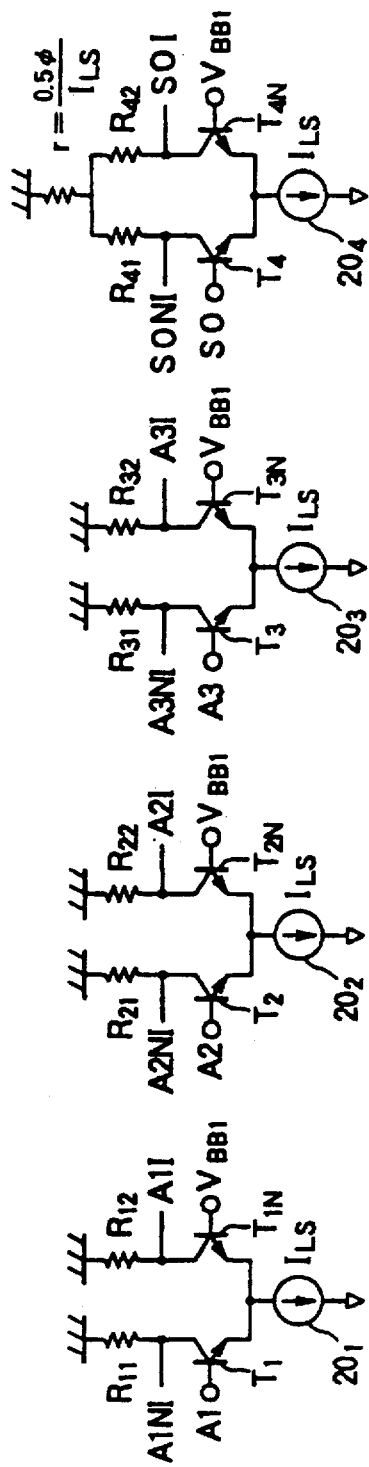
FIG. 26A FIG. 26B FIG. 26C FIG. 26D FIG. 26E FIG. 26F

LOW VOLTAGE BIPOLAR TRANSISTOR LOGIC CIRCUIT

BACKGROUND OF THE INVENTION

1. Field of the Invention

The present invention relates to a semiconductor integrated circuit device, and more specifically to a semiconductor integrated circuit device suitable for use in an ECL (Emitter Coupled Logic).

2. Description of the Prior Art

FIG. 1 shows a conventional semiconductor integrated circuit device including a three-stage series-gating differential logic circuit (in which single-ended logic circuits are series-gated in three stages) and an emitter follower output circuit using an NPN transistor 10. Each stage of the logic circuit is composed of two NPN transistors $Q_i$ and $Q_{iN}$ ($i=1$, 2 and 3) whose emitters are connected to each other. In the first (uppermost) stage logic circuit, the collector of the transistor $Q_1$ is connected to a ground supply voltage via a resistor $R_{L1}$; the base thereof is connected to an input terminal IN1; the collector of the transistor $Q_{1N}$ is connected to the ground supply voltage via a resistor $R_{L2}$; and a potential $V_{BB1}$ (an intermediate value of an amplitude of a signal potential $V_{IN1}$ inputted from the outside to the input terminal IN1) is applied to the base thereof. Further, the collector of the transistor $Q_2$ of the second (intermediate) stage logic circuit is connected to an emitter junction point C1 between the pair of first stage differential transistors $Q_1$ and $Q_{1N}$; a signal potential $V_{IN2}$ is inputted to the base of the transistor $Q_2$. The level of the signal potential $V_{IN2}$ is shifted by a level shift circuit composed of an NPN transistor $T_1$ and a constant current source $30_1$. Further, a potential $V_{BB2}$ (an intermediate value of an amplitude of a signal potential $V_{IN2}$) is applied to the base of the transistor $Q_{2N}$ of the pair of differential transistors $Q_2$ and $Q_{2N}$. Further, the collector of the transistor $Q_3$ of the third (lowermost) stage logic circuit is connected to an emitter junction point C2 between the pair of the second stage differential transistors $Q_2$ and $Q_{2N}$; a signal potential $V_{IN3}$ is inputted to the base of the transistor $Q_3$. The level of the signal potential $V_{IN3}$ is shifted by another level shift circuit composed of an NPN transistor $T_2$, a diode $D_1$ and a constant current source $30_2$. Further, a potential $V_{BB3}$ (an intermediate value of an amplitude of a signal potential $V_{IN3}$) is applied to the base of the transistor $Q_{3N}$ of the pair of differential transistors $Q_3$ and $Q_{3N}$. Further, a constant current source composed of an NPN transistor $Q_4$ and a resistor $R_{CS}$ is connected to a junction point C3 between the pair of differential transistors $Q_3$ and $Q_{3N}$. Further, an output $V_O$ of the differential logic circuit is taken out of the collector of the transistor $Q_{1N}$, and then transmitted to the base of an emitter follower transistor 10. A constant current source circuit composed of an NPN transistor $Q_5$ and a resistor $R_{EF}$ is connected to the emitter of the transistor 10, and an output OUT of the semiconductor integrated circuit device is taken out of the emitter of the transistor 10. Further, the resistances of the resistors $R_{L1}$ and $R_{L2}$ are equal to each other, and a potential $V_{CS}$ is applied to the bases of the transistors $Q_4$ and $Q_5$ of the constant current source circuit. Here, it is assumed that the built-in potential $\phi$ of the p-n junction is $\phi=0.9$ V (the potential $\phi$ being the base-emitter voltage of a transistor); the logical amplitude 2v of the single ended logic circuit is $2v=2\phi/3=0.6$ V; and the non-saturated range of the bipolar transistor is $V_{CE} \geq V_{CENS} = \phi/3 = 0.3$ V. Here, $V_{CE}$ denotes the collector-emitter voltage of the transistor; and $V_{CENS}$ denotes the minimum collector-emitter voltage at which the transistor will not be saturated.

In the semiconductor integrated circuit device as shown in FIG. 1, in general, signals whose levels are shifted by diodes (not shown) are inputted to the input terminals IN1, IN2 and IN3, respectively. Therefore, the potential $V_{IN1}$ applied to the base of the uppermost stage transistor $Q_1$ varies in a range from $(-\phi)$ to $(-\phi-2v)$; the potential $V_{IN2}$ applied to the base of the intermediate stage transistor $Q_2$ is a potential obtained by shifting the potential $V_{IN2}$ applied to the input terminal IN2 by $\phi$ by the transistor $T_1$ and varies in a range from $(-2\phi)$ to $(-2\phi-2v)$; and the potential $V_{IN3}$ applied to the base of the lowermost stage transistor $Q_3$ is a potential obtained by shifting the potential $V_{IN3}$ applied to the input terminal IN3 by $2\phi$ by the transistor $T_2$ and the diode $D_1$ and varies in a range from $(-3\phi)$ to $(-3\phi-2v)$, as shown in FIG. 2.

Therefore, the potential at the node C1 varies in a range from $(-2\phi)$ to $(-2\phi-v)$; the potential at the node C2 varies in a range from $(-3\phi)$ to $(-3\phi-v)$; and the potential at the node C3 varies in a range from $(-4\phi)$ to $(-4\phi-v)$; and further the output $V_o$ of the differential logic stage circuit varies in a range from $(0)$ to $(-2\ v)$, as shown in FIG. 2.

Therefore, the voltage applied to the uppermost stage logic circuit is the collector-emitter voltage $V_{CEQ1}$ ($\geq 2(\phi-v)=1.2$ V) of the transistor $Q_1$; the voltage applied to the intermediate stage logic circuit is the collector-emitter voltage $V_{CEQ2}$ ($\geq \phi-v=0.6$ V) of the transistor $Q_2$; and the voltage applied to the lowermost stage logic circuit is the collector-emitter voltage $V_{CEQ3}$ ($\geq \phi-v=0.6$ V) of the transistor $Q_3$, respectively.

Further, FIG. 3 shows another example of the conventional semiconductor integrated circuit device. This circuit device is formed such that three input terminals IN1N, IN2N and IN3N, two NPN transistors $T_{1N}$ and $T_{2N}$, and two constant current sources $30_{1N}$ and $30_{2N}$ are additionally provided in the semiconductor integrated circuit device shown in FIG. 1. Further, the circuit device shown in FIG. 3 is formed such that the three-stage series-gating single ended logic circuit of FIG. 1 is changed into a differential logic stage circuit. Further, the levels of potential $V_{INiN}$ applied to the input terminals INiN ($i=1, 2$ and 3) are shifted by diodes (not shown) in the same way as with the case of the potential $V_{IN1}$ applied to the input terminal IN1. Further, since the logical amplitude of the differential logic circuit is a half of the logical amplitude of the single ended logic circuit, the potentials $V_{INi}$ and $V_{INiN}$ applied to the input terminals INi and INiN ($i=1, 2$ and 3) vary in a range from $(-\phi)$ to $(-\phi-v)$, as shown in FIG. 4. In other words, the level of the potential applied to the base of the transistor $Q_{2N}$ is the potential from $(-2\phi)$ to $(-2\phi-v)$ shifted by $\phi$ by the transistor $T_{1N}$, and the level of the potential applied to the base of the transistor $Q_{3N}$ is the potential from $(-3\phi)$ to $(-3\phi-v)$ shifted by $2\phi$ by the transistor $T_{2N}$ and the diode $D_2$. Therefore, the respective node potentials of the three-stage series-gating differential logic circuit shown in FIG. 3 can be shown as in FIG. 4, which can be obtained by replacing v (shown in FIG. 2) with 0.5 v.

Table 1 shows voltages applied to the transistors of differential stages of the conventional semiconductor integrated circuit devices shown in FIGS. 1 and 3.

TABLE 1

|  | UPPER STAGE ($V_{CBQ1}$) | INTER STAGE ($V_{CBQ2}$) LOWER STAGE ($V_{CBQ3}$) |
|---|---|---|
| SINGLE ENDED TYPE | $2(\phi - v) = 1.2V$ | $\phi - v = 0.6V$ |
| DIFFERENTIAL TYPE | $2(\phi - 0.5v) = 1.5V$ | $\phi - 0.5v = 0.75V$ |

($\phi = 0.9V$; $v = 0.3V$)

As understood in Table 1, since the collector-emitter voltage $V_{CE}$ applied to the respective transistors of the differential stages is higher than $V_{CEmin}=\phi/3=0.3$ V, the respective transistors can operate always in the non-saturated range, irrespective of the supply voltage.

In the semiconductor integrated circuits shown in FIGS. 1 and 3, however, when the supply voltage $V_{EE}$ applied to the lower end (in the figures) of the resistor $R_{CS}$ and $R_{EF}$ is reduced, since the transistor $Q_4$ constituting the constant current source circuit of the differential stage enters the saturated range, the current of the constant current source circuit decreases abruptly and thereby the output amplitude decreases, so that the semiconductor integrated circuits may operate erroneously. Here, if the voltage applied across the constant current source circuit composed of the transistor $Q_4$ and the resistor $R_{CS}$ is expressed as $V_{CSmin}$ (=$V_{CEQ4min}$+$V_{RCS4min}$: about 0.7 V), the minimum operating supply voltage |$V_{EEmin}$| of the ECL (Emitter Coupled Logic) circuit can be expressed as listed in Table 2.

TABLE 2

| NO. OF STAGES | |$V_{EEmin}$| | |
|---|---|---|
|  | SINGLE ENDED TYPE | DIFFERENTIAL TYPE |
| 3 STAGES | $4\phi + v + V_{CSmin} = 4.6V$ | $4\phi + 0.5v + V_{CSmin} = 4.45V$ |
| 2 STAGES | $3\phi + v + V_{CSmin} = 3.7V$ | $3\phi + 0.5v + V_{CSmin} = 3.55V$ |
| 1 STAGE | $2\phi + v + V_{CSmin} = 2.8V$ | $2\phi + 0.5v + V_{CSmin} = 2.65V$ |

$\phi = 0.9V$; $v = 0.3V$; $V_{CSmin} = 0.7V$)

Table 2 indicates that it is effective to reduce the value $\phi$ when the voltage of the ECL circuit is required to be reduced. On the other hand, Table 1 indicates that even if $\phi$ is reduced, there still exists a margin until the respective transistors of the differential stages enter the saturation range.

However, $\phi$ cannot be much varied even if the impurity concentration of the p-n junction is varied. Therefore, the value $\phi$ is roughly constant in all the device generations, so that it has been impossible to reduce the minimum operating voltage of the ECL circuit.

SUMMARY OF THE INVENTION

With these problems in mind, therefore, it is the object of the present invention to provide a semiconductor integrated circuit device operative at a low supply voltage, without deteriorating the functions and performance thereof as much as possible.

To achieve the above-mentioned object, the first aspect of the present invention provides a semiconductor integrated circuit device, comprising: a differential logic stage circuit formed by multi-stage series-gating logic circuits each composed of a plurality of bipolar transistors whose emitters are connected in common; and a plurality of level shift circuits each for shifting each level of an input signal inputted from the outside in correspondence to each stage logic circuit of said differential logic stage circuit, and for outputting each level-shifted input signal to each of bases of the bipolar transistors of the corresponding stage logic circuit. In each of said level shift circuits, a potential difference between the level-shifted signals inputted to the bases of the bipolar transistors of the logic circuits connected to each other is determined, as a level shift rate, to be lower than a built-in potential between the base and emitter of each of the bipolar transistors.

Further, the second aspect of the present invention provides a semiconductor integrated circuit device, comprising: a differential logic circuit formed by multi-stage series-gating logic circuits each composed of a plurality of bipolar transistors whose emitters are connected in common, a first specific circuit, among the multi-stage series-connected logic circuits, being connected to a current source and a second specific circuit being connected to at least one load circuit; and a plurality of level shift circuits each for shifting each level of an input signal inputted from the outside in correspondence to each stage logic circuit of said differential logic circuit, and for outputting each level-shifted input signal to each of bases of the bipolar transistors of the corresponding stage logic circuit except the first specific circuit. In each of said level shift circuits, a potential difference between the level-shifted signals inputted to the bases of the bipolar transistors of the logic circuits connected to each other is determined, as a level shift rate, to be lower than a built-in potential between the base and emitter of each of the bipolar transistors.

Further, in the first and second aspects of the present invention, the logic circuits of said differential logic circuit are of differential type, and said level shift circuits are composed of differential current mode logic gates.

Further, in the first and second aspects of the present invention, the logic circuits of said differential logic circuit are of differential type, and said level shift circuits are composed of single ended current mode logic gates.

Further, in the first and second aspect of the present invention, the logic circuits of said differential logic circuit are of single ended type, and said level shift circuits are composed of single ended current mode logic gates.

Further, the third aspect of the present invention provides a semiconductor integrated circuit device, comprising: a plurality of first to n-th (n≥2) differential logic circuits each formed by multi-stage series gating logic circuits each composed of a plurality of bipolar transistors whose emitters are connected in common, a first specific circuit, among the multi-stage series-gating logic circuits, being connected to a current source and a second specific circuit, among the multi-stage series-gating logic circuits, being connected to at least one load resistor; and a plurality of level shift circuits each for shifting each level of an input signal inputted from the outside in correspondence to each stage logic circuit of said first differential logic stage circuit, and for outputting each level-shifted input signal to each of the bases of the bipolar transistors of the corresponding logic circuit. In each of said level shift circuits, a potential difference between the level-shifted signals inputted to the bases of the bipolar transistors of the logic circuits of said first differential logic circuit is determined, as a level shift rate, to be lower than a built-in potential between the base and emitter of each of the bipolar transistors thereof. The first to n-th differential logic circuits are connected in cascade at n-stages, and a resistor is connected between the load resistor and a power supply, of each of said first to (n−1)-th differential logic circuits, and the supply voltage so that the input levels of the second to n-th differential logic circuits are equalized to the input level of the first differential logic stage circuit.

In the first to third aspects of the present invention, the current source may be interpreted as a resistor.

In the semiconductor integrated circuit device according to the present invention, a potential difference between the signals inputted to the bases of the bipolar transistors of the differential logic circuits is determined, as a level shift rate, to be lower than a built-in potential φ between the base and emitter of the bipolar transistors. Accordingly, it is possible to reduce the level of the input signal applied to each transistor to a limit at which each transistor of each differential stage enters the saturation range, with the result that the semiconductor integrated circuit device according to the present invention is operative on a lower supply voltage, without degrading the functions and performance thereof as much as possible.

BRIEF DESCRIPTION OF THE DRAWINGS

FIG. 7 is a circuit diagram showing a second embodiment of the semiconductor integrated circuit device according to the present invention;

FIG. 17 is a circuit diagram showing a seventh embodiment of the semiconductor integrated circuit device according to the present invention;

FIGS. 25A to 25F are circuit diagrams showing an eleventh embodiment of the semiconductor integrated circuit device according to the present invention;

FIGS. 26A to 26F are circuit diagrams showing a twelfth embodiment of the semiconductor integrated circuit device according to the present invention;

DETAILED DESCRIPTION OF THE PREFERRED EMBODIMENTS

Figure 5:
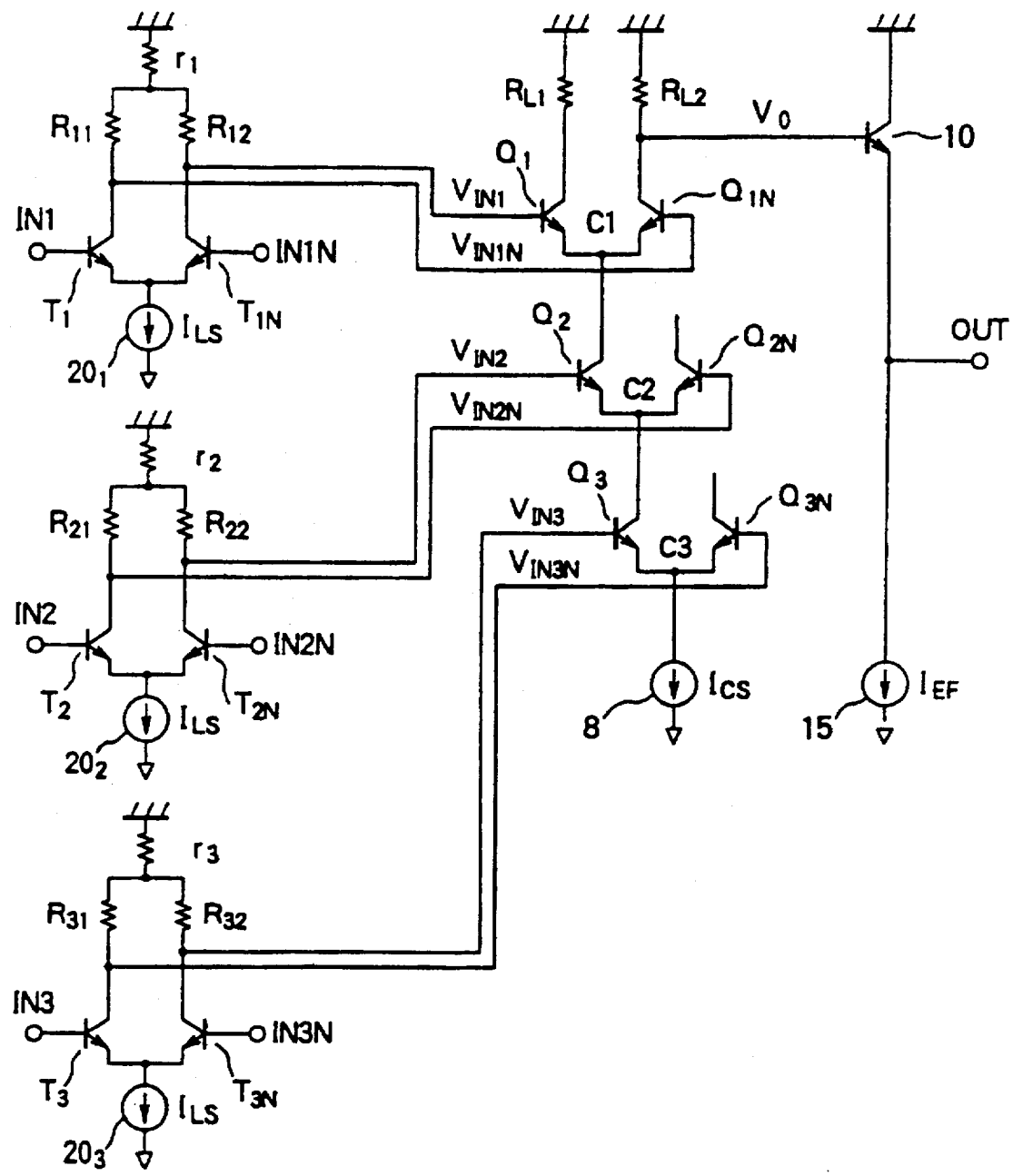
FIG. 5 is a circuit diagram showing a first embodiment of the semiconductor integrated circuit device according to the present invention.

FIG. 5 shows a first embodiment of the semiconductor integrated circuit device according to the present invention. This circuit device is composed of three-stage series-gating differential logic circuit, first to third level shifter circuits, and an emitter follower output circuit. Each stage of the logic circuit is composed of two NPN transistors $Q_i$ and $Q_{iN}$ (i=1, 2 and 3). The collector of the transistor $Q_1$ of the first (uppermost) stage logic circuit is connected to a ground supply voltage via a load resistor $R_{L1}$; and the collector of the transistor $Q_{1N}$ thereof is connected to a ground supply voltage via a load resistor $R_{L2}$. Further, the collector of the transistor $Q_2$ of the second (intermediate) stage logic circuit is connected to an emitter junction point C1 between the pair of preceding stage differential transistors $Q_i$ and $Q_{1N}$. Further, the collector of the transistor $Q_3$ of the third (lowermost) stage logic circuit is connected to an emitter junction point C2 between the pair of second stage differential transistors $Q_2$ and $Q_{2N}$. Further, an emitter junction point C3 between the pair of third stage differential transistors $Q_3$ and $Q_{3N}$ is connected to a drive supply voltage via a constant current source 8. Further, the resistances of both resistors $R_{L1}$ and $R_{L2}$ are equal to each other.

On the other hand, the i-th (i=1, 2 and 3) level shift circuit is composed of a resistor $r_i$, a resistor $R_{i1}$, a resistor $R_{i2}$, a pair of differential NPN transistors $T_i$ and $T_{iN}$, and a constant current source $20_i$. One end of the resistor $r_i$ (i=1, 2 and 3) is connected to the ground supply voltage, and the other end thereof is connected to one end of the two resistors $R_{i1}$ and $R_{i2}$. The other end of the resistor $R_{i1}$ (i=1, 2 and 3) is connected to the collector of the transistor $T_i$, and the other end of the resistor $R_{i2}$ (i=1, 2 and 3) is connected to the collector of the transistor $T_{iN}$. The emitters of the pair of the differential transistors $T_i$ and $T_{iN}$ (i=1, 2 and 3) are connected in common to a drive supply voltage via the constant current source $20_i$. The base of transistor $T_i$ (i=1, 2 and 3) is connected to an input terminal $IN_i$ to which an external signal is inputted, and the base of transistor $T_{iN}$ (i=1, 2 and 3) is connected to an input terminal $IN_{iN}$. Further, one output $V_{INi}$ of the i-th (i=1, 2 and 3) level shift circuit is outputted from the collector of the transistor $T_{iN}$ and then transmitted to the base of the transistor $Q_i$ of the i-th stage logic circuit, and the other output $V_{1NiN}$ of the i-th (i=1, 2 and 3) level shift circuit is outputted from the collector of the transistor $T_i$ and then transmitted to the base of the transistor $Q_{iN}$ of the i-th stage differential ECG gate. Further, the resistances of the resistors $R_{11}$, $R_{12}$, $R_{21}$, $R_{22}$, $R_{31}$ and $R_{32}$ are equal to each other; and the current $I_{LS}$ flowing through the constant current sources $20_1$, $20_2$ and $20_3$ are also equal to each other.

Further, the output $V_o$ of the differential logic circuit is outputted from the collector of the transistor $Q_{1N}$, transmitted to the base of the transistor 10 of the output circuit, and then outputted from the emitter of the transistor 10 to the outside. Further, the transistor 10 is connected to a supply voltage via a constant current source 15.

Figure 1:
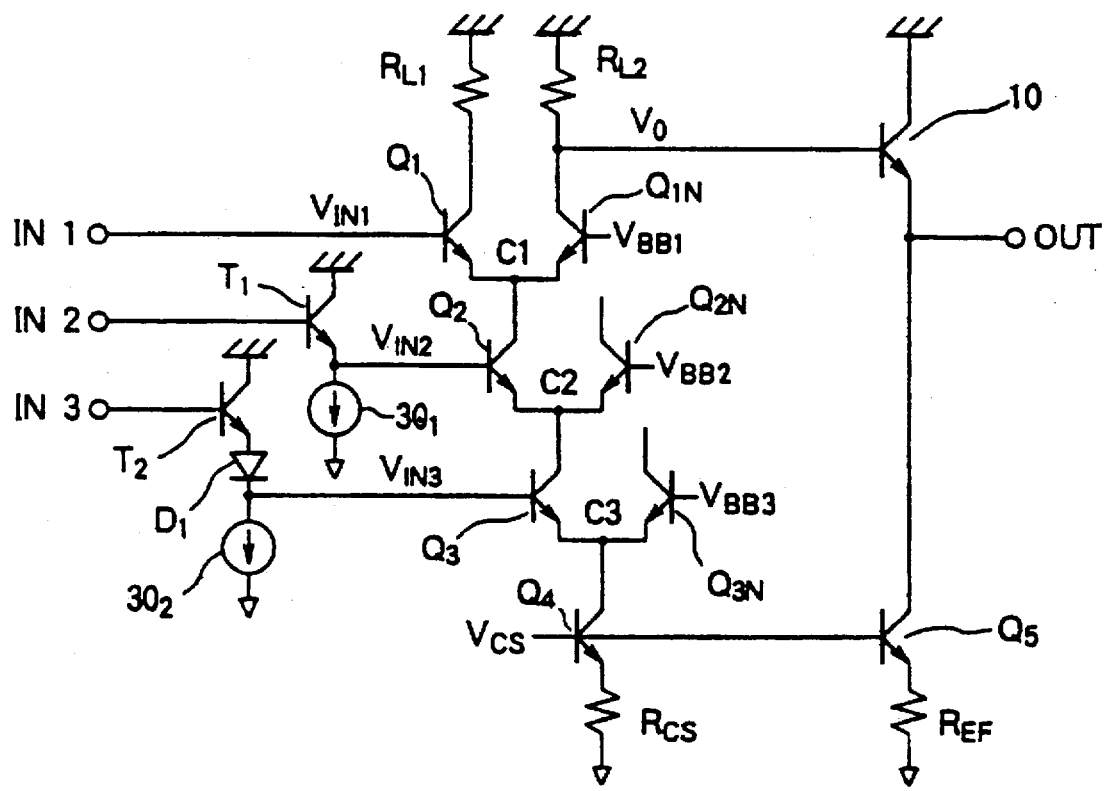
FIG. 1 is a circuit diagram showing the first prior art semiconductor integrated circuit device.
Figure 2:
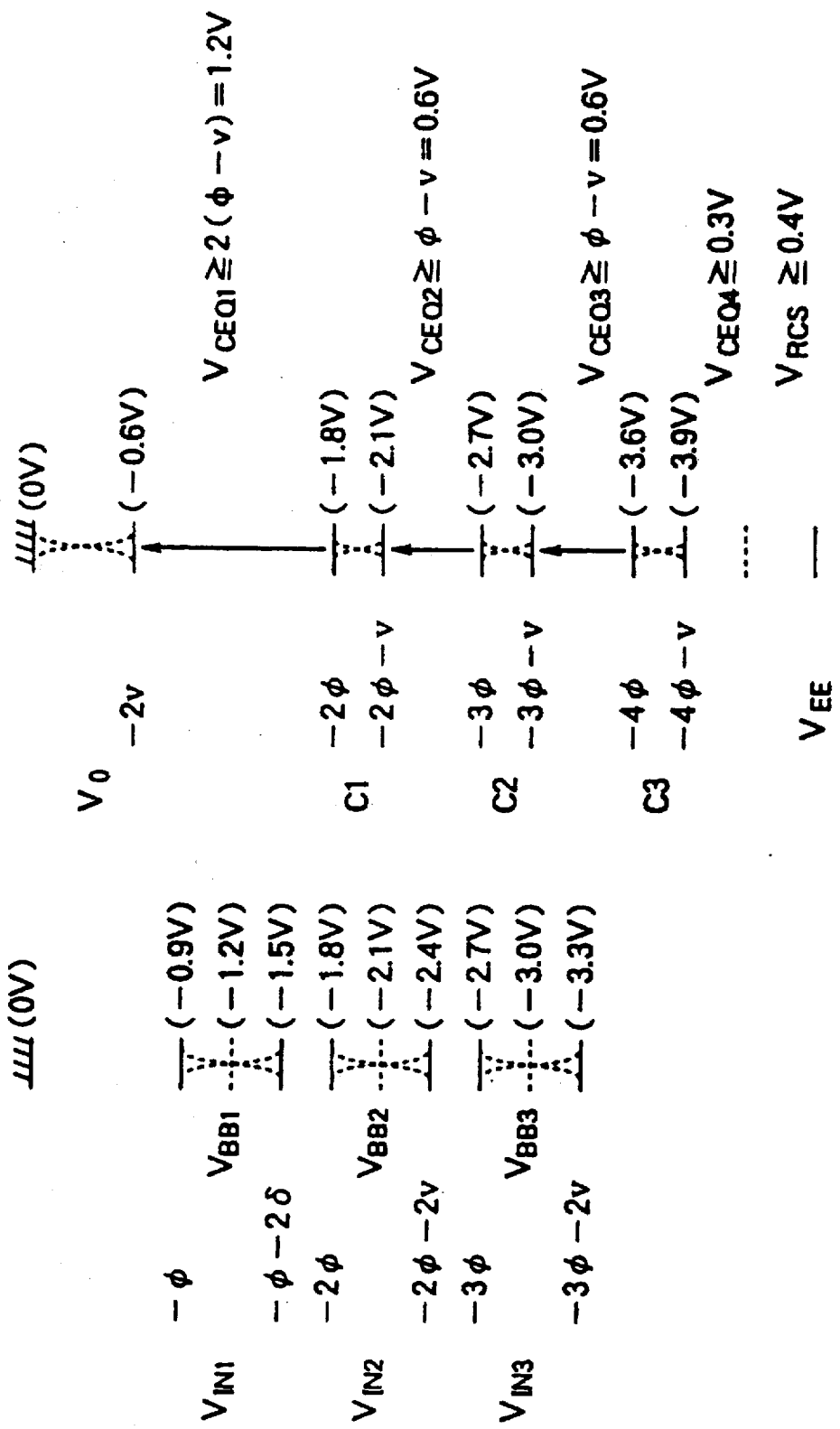
FIG. 2 is a typical diagram showing the potential levels of the respective nodes of the first prior art circuit device shown in FIG. 1.
Figure 3:
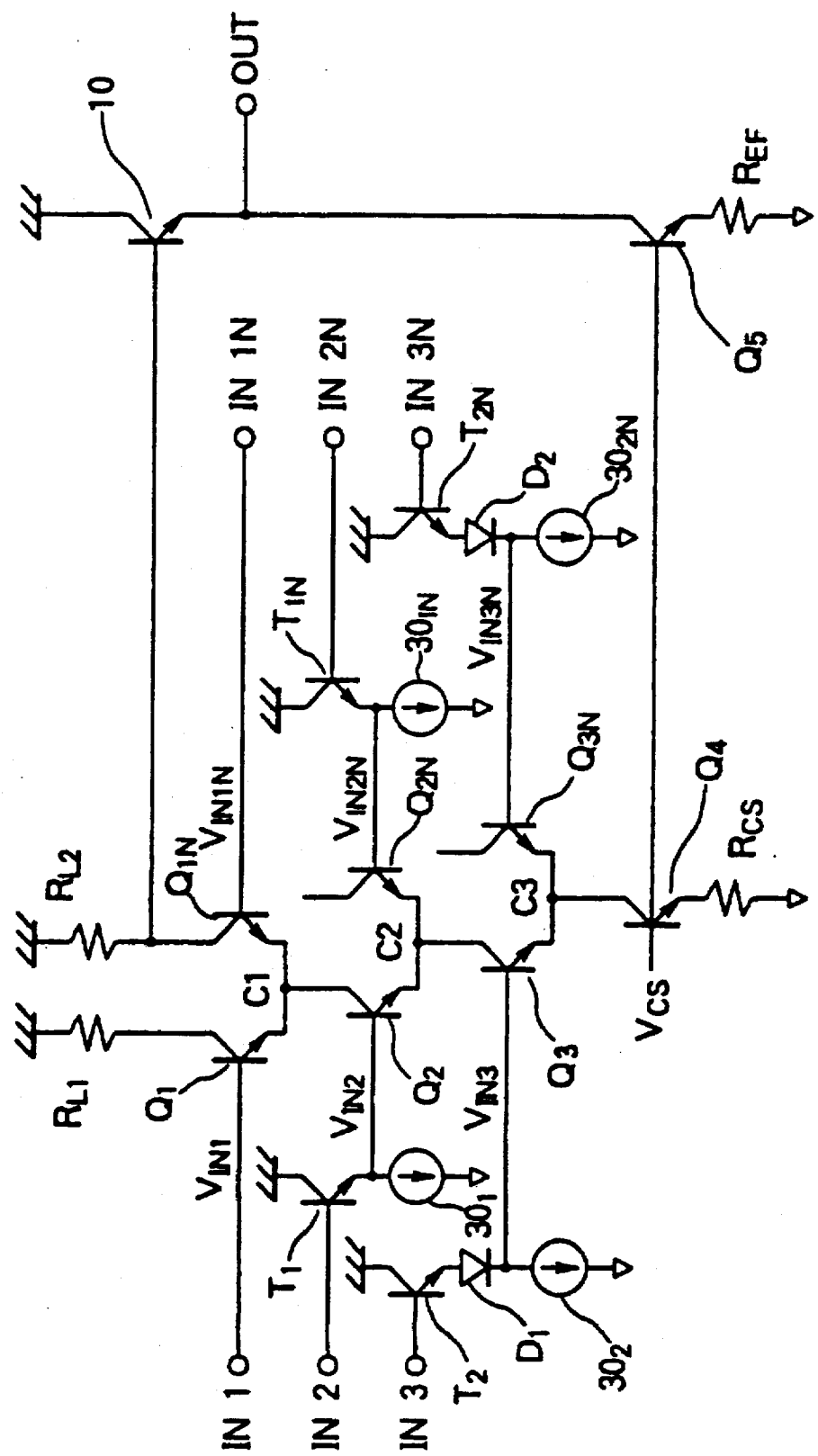
FIG. 3 is a circuit diagram showing the second prior art semiconductor integrated circuit device.
Figure 4:
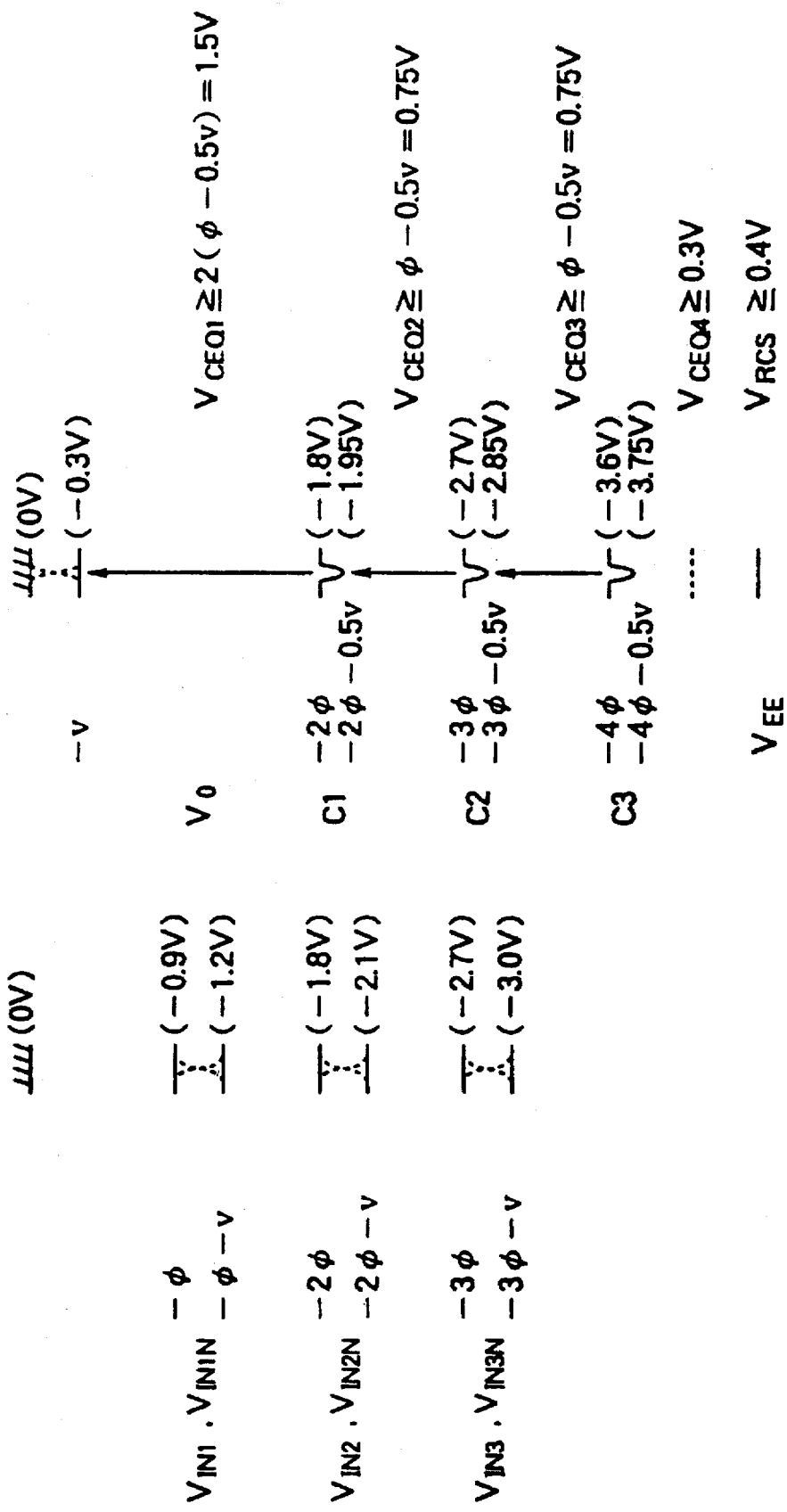
FIG. 4 is a typical diagram showing the potential levels of the respective nodes of the first prior art circuit device shown in FIG. 3.

In the first embodiment of the semiconductor integrated circuit device according to the present invention, the first to third level shift circuits of CML (Current Mode Logic) gate type are used as the level shift circuits for the input signals of the differential logic circuit, instead of the level shift circuit of diode type (See FIG. 3). In these level shift circuits, the resistances of the resistors $r_1$, $r_2$ and $r_3$ and the current values $I_{LS}$ of the constant current sources $20_1$, $20_2$ and $20_3$ are so selected as to satisfy the following formula (1)

$$I_{LS}\cdot(r_2-r_1)=I_{LS}\cdot(r_3-r_2)=\phi^* \qquad (1)$$

Then, the potentials $V_{IN2}$ and $V_{IN2N}$ applied to the bases of the transistors $Q_2$ and $Q_{2N}$ of the intermediate stage logic circuit are level-shifted by $\phi^*$ from the potentials $V_{IN1}$ and $V_{IN1N}$ applied to the bases of the transistors $Q_1$ and $Q_{1N}$ of the uppermost stage logic circuit; and the potentials $V_{IN3}$ and $V_{IN3N}$ applied to the bases of the transistors $Q_3$ and $Q_{3N}$ of the lowermost stage logic circuit are further level-shifted by $\phi^*$ from the potentials $V_{IN2}$ and $V_{IN2N}$ applied to the bases of the transistors $Q_2$ and $Q_{2N}$ of the intermediate stage logic circuit.

Figure 6:
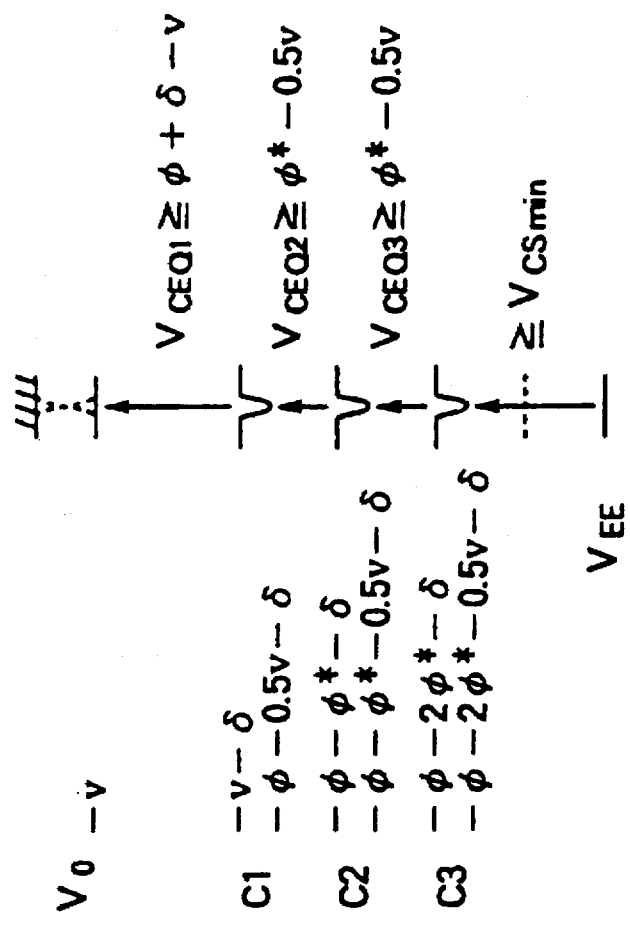
FIG. 6 is a typical diagram showing the potential levels at the respective nodes of the first embodiment thereof.
Figure 6:
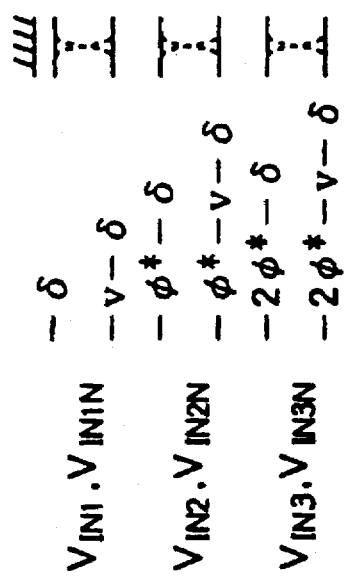

Here, since the potentials $V_{IN1}$ and $V_{IN1N}$ vary within a range from $(-\delta(=I_{LS}\cdot r_1))$ to $(-v-\delta)$, the potentials $V_{IN2}$ and $V_{IN2N}$ vary within a range from $(-\phi^*-\delta)$ to $(-\phi^*-v-\delta)$, and the potentials $V_{IN3}$ and $V_{IN3N}$ vary within a range from $(-2\phi^*-\delta)$ to $(-2\phi^*-v-\delta)$ (as shown in FIG. 6). As a result, the voltages $V_{CEQ1}$, $V_{CEQ2}$, and $V_{CEQ3}$ applied to the uppermost, intermediate and lowermost differential transistors can be expressed, respectively as $$V_{CEQ1}=2((\phi+\delta)/2-0.5\,v)$$
$$V_{CEQ2}=\phi^*-0.5\,v$$
$$V_{CEQ3}=\phi^*-0.5\,v \qquad (2)$$

Therefore, it is possible to freely vary the operating points of the respective transistors by varying $\phi^*$ and $\delta$ to a limit $V_{CENS}$ at which the transistor enters the saturation range.

When comparing the above formula (2) with the voltages $V_{CE}$ applied to the respective transistors of the conventional differential logic circuit as listed in Table 1, it can be understood that $\phi^*$ corresponds to that obtained by reducing $\phi$ from the circuit standpoint.

Here, the conditions that the respective transistors of the differential stages will not enter the saturation range can be obtained as $$\phi-v+\delta \geq V_{CENS}$$

$$\phi^*-0.5\,v \geq V_{CENS}$$

By substituting $v=\phi/3$ and $V_{CENS}=\phi/3$ (explained under Description of Prior Art) into the above formula, the following formulae can be obtained $$\delta \geq 0$$

$$\phi^* \geq 0.5\,v \qquad (3)$$

On the other hand, since the potentials $V_{IN3}$ and $V_{IN3N}$ inputted to the lowermost logic circuit decrease with increasing $\phi^*$, care must be taken so that the transistors $T_3$ and $T_{3N}$ of the third level shift circuit do not saturate. The conditions that the transistors $T_3$ and $T_{3N}$ of the third level shift circuit do not saturate are $$(-2\phi^*-v-\delta)-(-2\phi) \geq V_{CENS}$$

Therefore, $$\phi^* \leq \phi-)v+\delta+V_{CENS})/2$$

By substituting $v=\phi/3$ and $V_{CENS}=\phi/3$ into the above formula, the following formulae can be obtained $$\phi^* \leq 2\phi/3-\delta/2 \qquad (4)$$

The possible range of $\phi^*$ can be obtained from the above formulae (3) and (4) as $$0.5\phi \leq \phi^* \leq 2\phi/3-0.5\delta \qquad (4')$$

As a result, $\phi$ can be reduced from 0.5 to 2/3 times from the circuit standpoint.

Here, the minimum operating voltage $V_{EEmin}$ of the first embodiment of the semiconductor integrated circuit shown in FIG. 5 can be calculated as follows:

$$|V_{EEmin}|=2\phi^*+\phi+0.5v+\delta+V_{CSmin} \qquad (5)$$

Therefore, according to the degree of reduction of $\phi$, $$|V_{EEmin}| \geq \phi^*/2+0.5v\ 30\ V_{CSmin}=2.65\ V$$

$$|V_{EEmin}| \geq 2\phi^*/3+0.5v+V_{CSmin}=2.95\ V$$

That is, the operating voltage can be minimized as follows:

$$2.65 \text{ V} \leq V_{EEmin} \leq 2.95 \text{ V}$$

Further, FIG. 6 shows the typical potential levels at the respective nodes of the ECG circuit of the first embodiment shown in FIG. 5.

FIG. 7 shows a second embodiment of the semiconductor integrated circuit according to the present invention. The semiconductor integrated circuit in this embodiment, is formed such that the resistance $r_1$ of the first level shift circuit of the first embodiment shown in FIG. 5 is zeroed, and further the third level shift circuit is eliminated so that the input terminals IN3 and IN3N are directly connected to the bases of the lowermost stage differential transistors $Q_3$ and $Q_{3N}$ of the ECG circuit.

Figure 8:
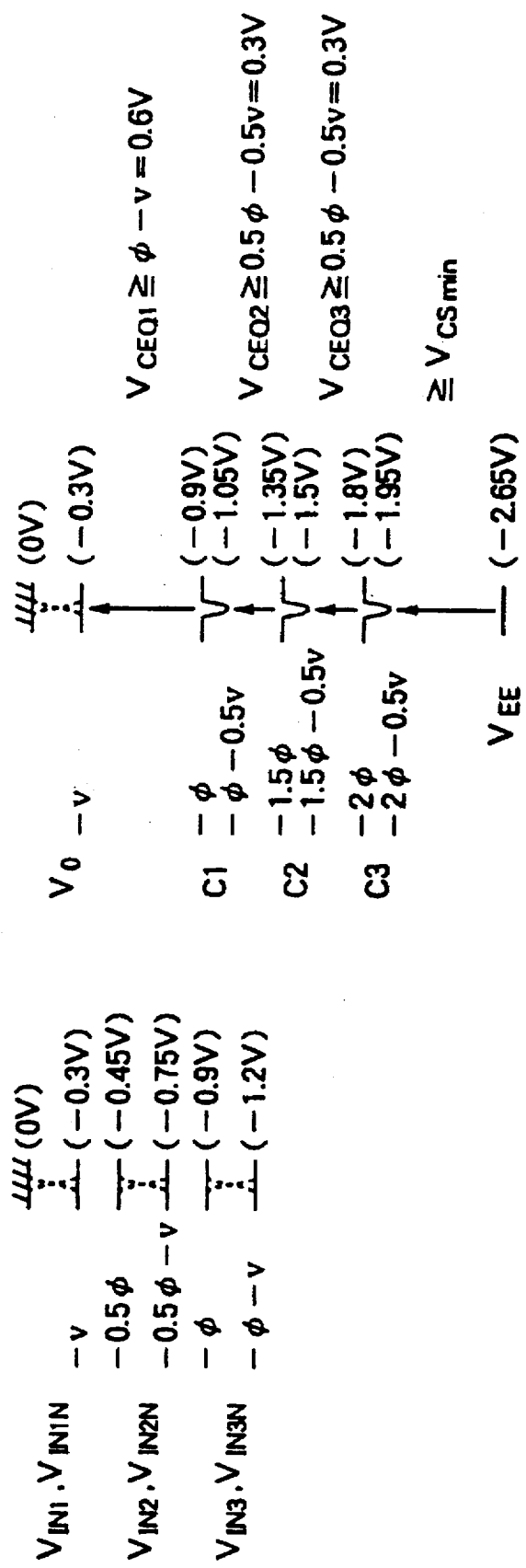
FIG. 8 is a typical diagram showing the potential levels at the respective nodes of the second embodiment thereof.

Therefore, this second embodiment corresponds to the first embodiment of the semiconductor integrated circuit device, in which the p-n junction built-in potential $\phi^*$ is reduced down to $\phi^*=0.5\phi$ and $\delta=0$. FIG. 8 shows the typical potential levels at the respective nodes of the second embodiment shown in FIG. 7. The minimum operating voltage $V_{EEmin}$ of this second embodiment of the semiconductor integrated circuit device can be obtained in accordance with the formula (5) as follows:

$$|V_{EEmin}|=2\phi+0.5v+V_{CSmin}$$

Therefore, it is possible to operate the three-stage series-gating differential logic circuit at the minimum voltage (about 2.65 V), which is the same as that of the conventional single-stage differential logic circuit (Table 2).

In general, in the case of the series-gating differential logic circuit, since the longest time needed is when the lowermost stage signal is propagated, when the external signal is directly inputted to the lowermost stage as with the case of this second embodiment, it is possible to reduce the delay time along the critical path (the path in a circuit which needs the longest time to propagate a signal).

Figure 9:
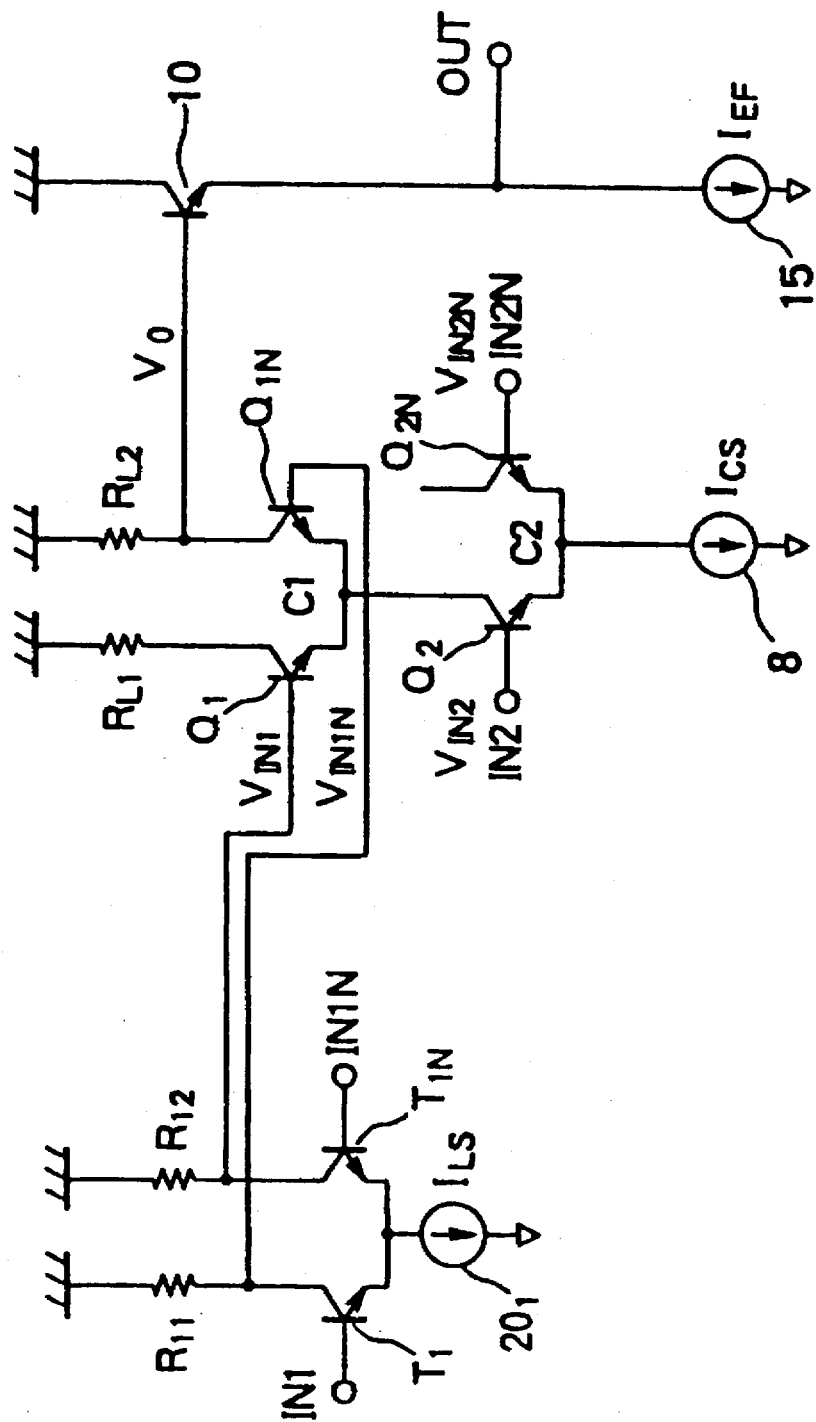
FIG. 9 is a circuit diagram showing a third embodiment of the semiconductor integrated circuit device according to the present invention.
Figure 10:
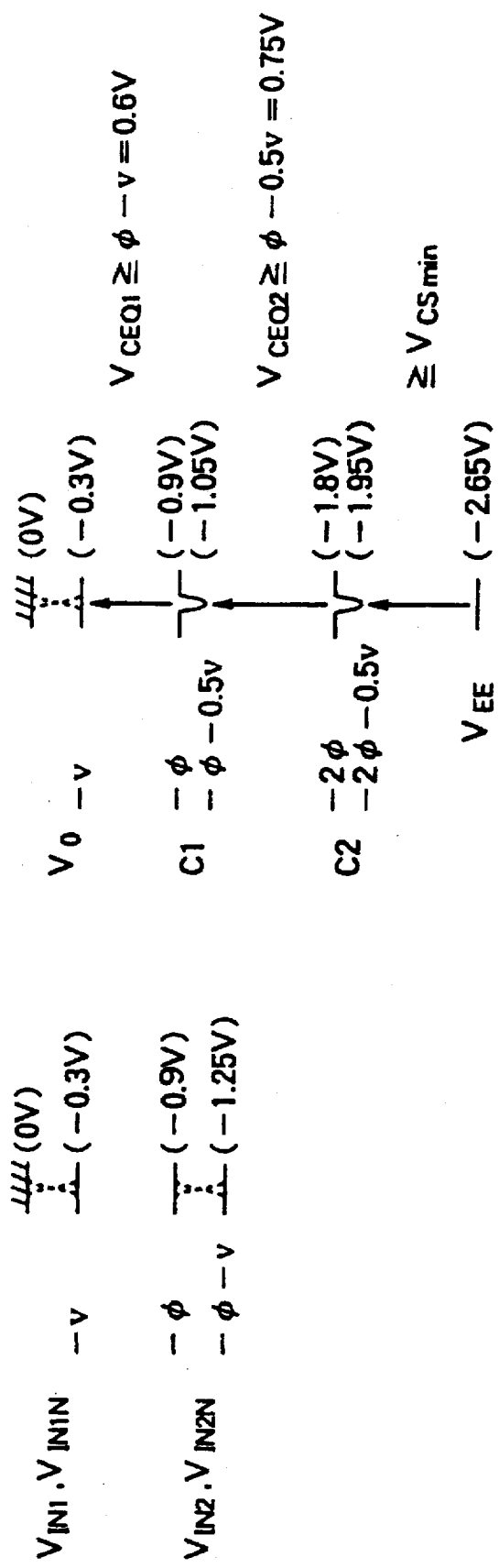
FIG. 10 is a typical diagram showing the potential levels at the respective nodes of the third embodiment thereof.

FIG. 9 shows a third embodiment of the semiconductor integrated circuit according to the present invention. The semiconductor integrated circuit in this embodiment, is formed such that the three-stage series-gating differential logic circuit of the second embodiment is reduced to the two-stage series-gating differential logic circuit, and further the second level shift circuit is eliminated so that the input terminals IN2 and IN2N are directly connected to the bases of the lowermost stage differential transistors $Q_2$ and $Q_{2N}$. FIG. 10 shows the typical potential levels at the respective nodes of the third embodiment shown in FIG. 9. The calculated minimum operating voltage $V_{EEmin}$ of the third embodiment is the same (about 2.65 V) as with the case of the second embodiment. This is because in the case of the reduction of $\phi^*=0.5\phi$, since the minimum operating voltage of the three-stage series-gating differential logic circuit is already equalized to that of the level shift circuit of the single-stage differential logic circuit as already shown in the second embodiment, even if the number of stages of the differential circuits is reduced down to two stages or less, it is impossible to further reduce the minimum operating voltage.

Figure 11:
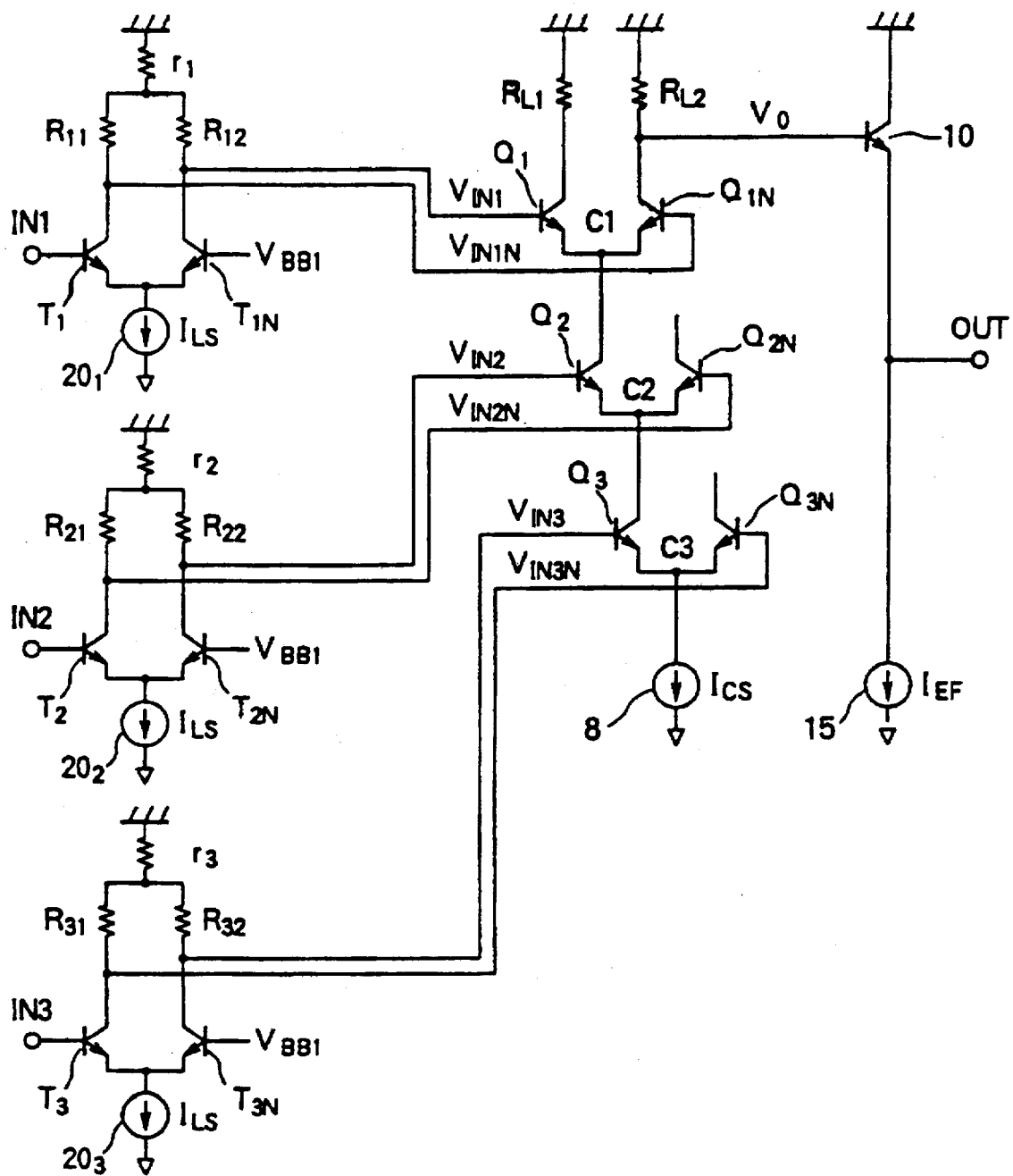
FIG. 11 is a circuit diagram showing a fourth embodiment of the semiconductor integrated circuit device according to the present invention.

FIG. 11 shows a fourth embodiment of the semiconductor integrated circuit according to the present invention. In this embodiment, the gist of the present invention is applied to the single ended three-stage series-gating ECL (Emitter Coupled Logic) circuit; that is, the semiconductor integrated circuit of FIG. 11 is formed such that the first to third level shift circuits of the first embodiment of the semiconductor integrated circuit device shown in FIG. 5 are replaced with single ended circuits. In more detail, in the i-th (i=1, 2 and 3) level shift circuit, a predetermined potential $V_{BBi}$ is applied to the base of the differential transistor $T_{iN}$, without being connected to the input terminal INiN. The potential $V_{BBi}$ is an intermediate value from $(-\phi)$ to $(-\phi-2v)$ of the amplitude of the potential applied to the input terminal INi (i=1, 2 and 3). Further, in this fourth embodiment of the differential logic circuit, the product of the resistor $R_{L1}$ (or $R_{L2}$) and the current flowing through the constant current source circuit 8 are two twice larger than in the first embodiment. Therefore, the amplitude (2v) of the output $V_O$ of the differential logic circuit becomes two times larger than the amplitude (v) of the first embodiment, so that the voltage $V_{CEQ1}$ applied to the uppermost stage transistors $Q_1$ and $Q_{1N}$ of the differential logic circuit is compressed, as compared with the case of the first embodiment, as follows:

$$V_{CEQ1}=\phi-2v-\delta$$

Therefore, the following formula must be satisfied in order that the transistors $Q_1$ and $Q_{1N}$ may not be saturated:

$$\phi-2v+\delta \geq V_{CENS}$$

When this formula is calculated by use of $v=\phi/3$ and $V_{CENS} \geq \phi/3$, $$\delta \geq 0$$

can be obtained, so that the formula (3) can be established as it is.

Figure 12:
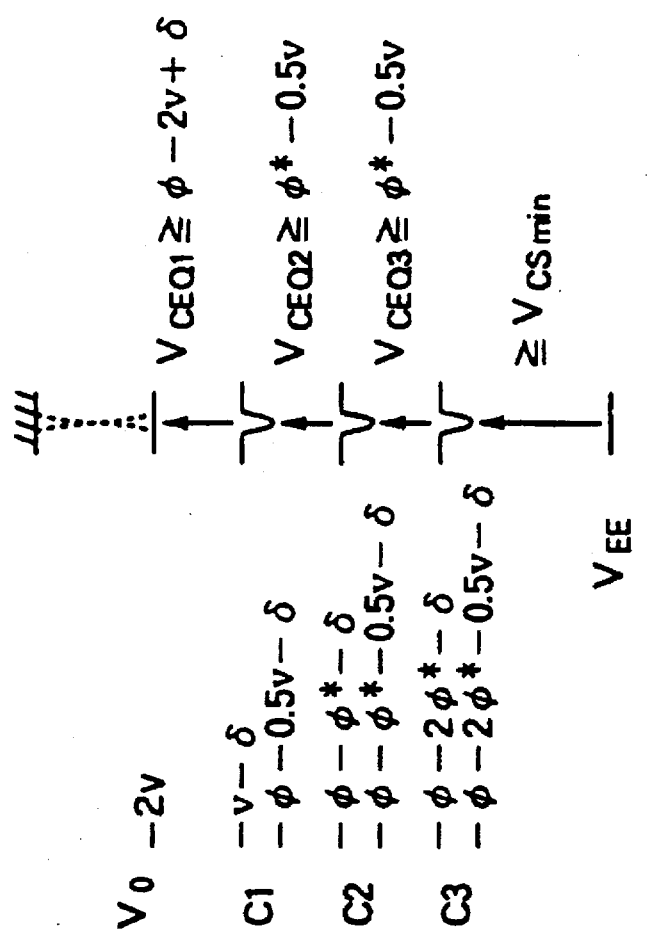
FIG. 12 is a typical diagram showing the potential levels at the respective nodes of the fourth embodiment thereof.
Figure 12:
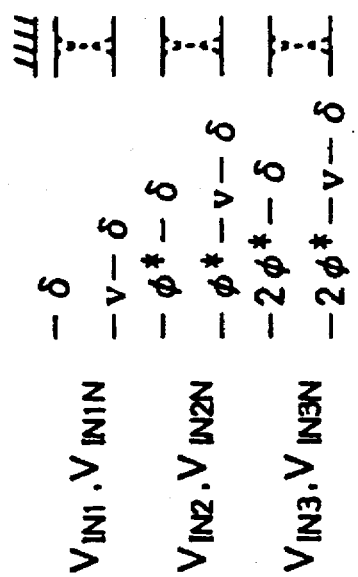

Further, in the fourth embodiment, since the level shift circuit is changed from the differential type to the single ended type, as understood by Table 2, the operating supply voltage of the level shift circuit itself increases from $(2\phi+0.5 v+V_{CSmin})$ to $(2\phi+v+V_{CSmin})$. As a result, the absolute value of the minimum operating supply voltage $V_{EEmin}$ of the semiconductor integrated circuit device is the larger value of either of $(2\phi+v+V_{CSmin})$ and $(2\phi^*+\phi+0.5 v+\delta+V_{CSmin})$. FIG. 12 shows the typical potential levels at the respective nodes of the fourth embodiment shown in FIG. 11.

Figure 13:
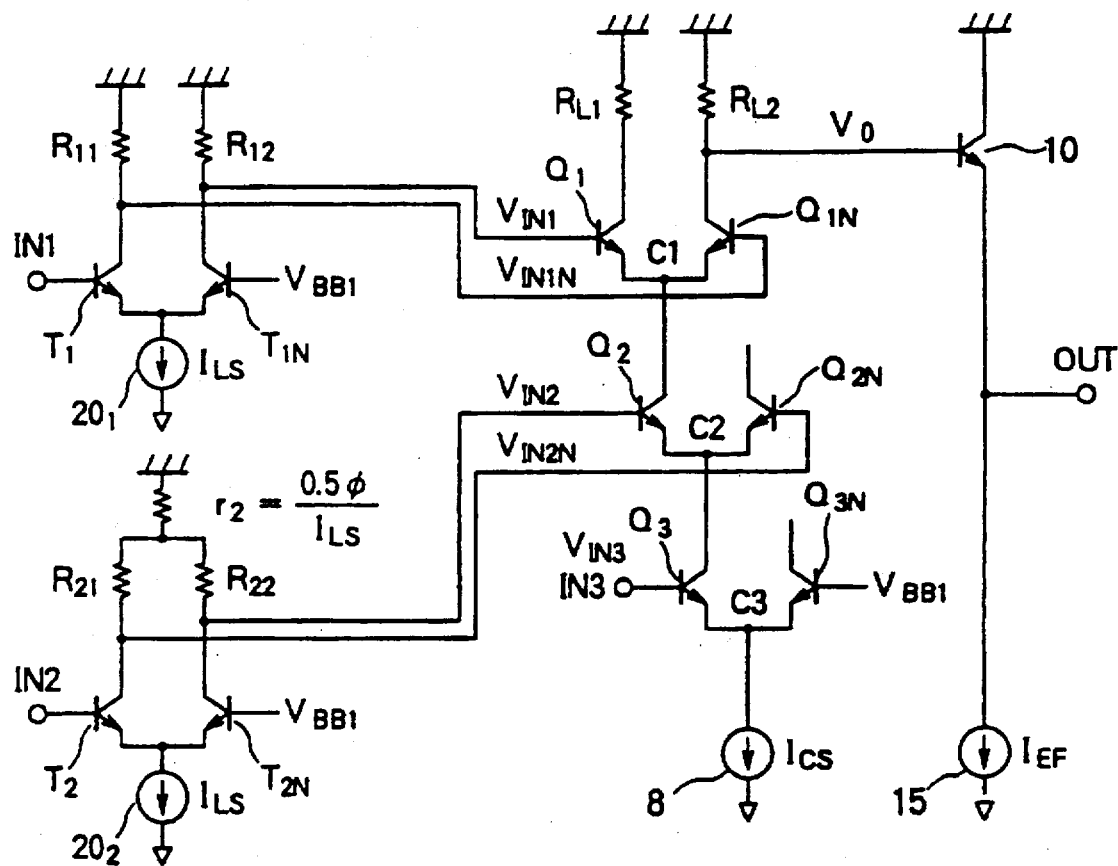
FIG. 13 is a circuit diagram showing a fifth embodiment of the semiconductor integrated circuit device according to the present invention.

FIG. 13 shows a fifth embodiment of the semiconductor integrated circuit according to the present invention. The semiconductor integrated circuit of FIG. 13 is formed such that $\phi$ is reduced down to $\phi^*=0.5\phi(=0.45 \text{ V})$; $\delta=0$; and $r_1=0$ in the fourth embodiment shown in FIG. 11. For the same reason as with the case of the differential type (as explained in the second embodiment), the third level shift circuit is not needed so that the input signals are directly inputted to the base of the differential transistors $Q_3$ and $Q_{3N}$ of the lowermost stage logic circuit.

The absolute value of the minimum operating voltage $V_{EEmin}$ of this fifth embodiment of the semiconductor integrated circuit device can be obtained in accordance with the formula (6) as follows:

$$|V_{EEmin}|=2\phi+v+V_{CSmin}=2.8 \text{ V}$$

Figure 14:
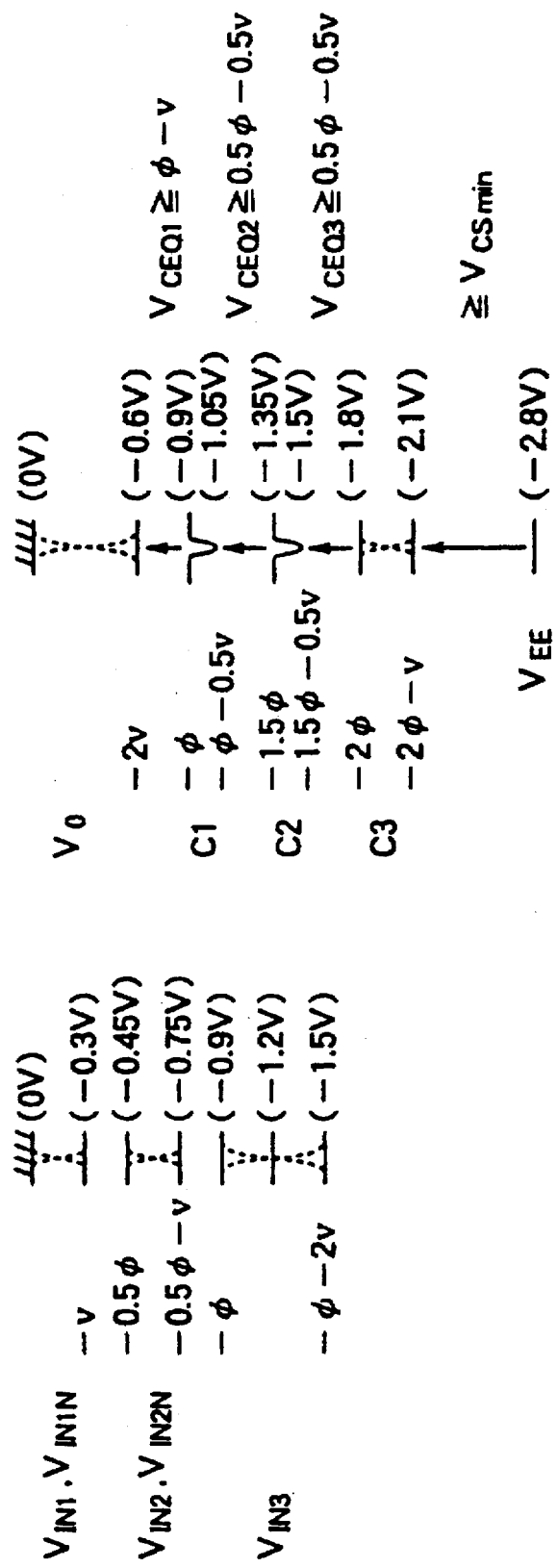
FIG. 14 is a typical diagram showing the potential levels at the respective nodes of the fifth embodiment thereof.

Therefore, it is possible to operate the three-stage series-gating differential logic circuit at the minimum voltage (about 2.8 V) which is the same as with the case of the conventional single-stage differential logic circuit. FIG. 14 shows the typical potential levels at the respective nodes of the fifth embodiment shown in FIG. 13.

Further, in this fifth embodiment, since the input signals are directly inputted to the transistors of the lowermost stage single ended type logic circuit, it is possible to shorten the delay time through the critical path, as compared with the case of the fourth embodiment.

Figure 15:
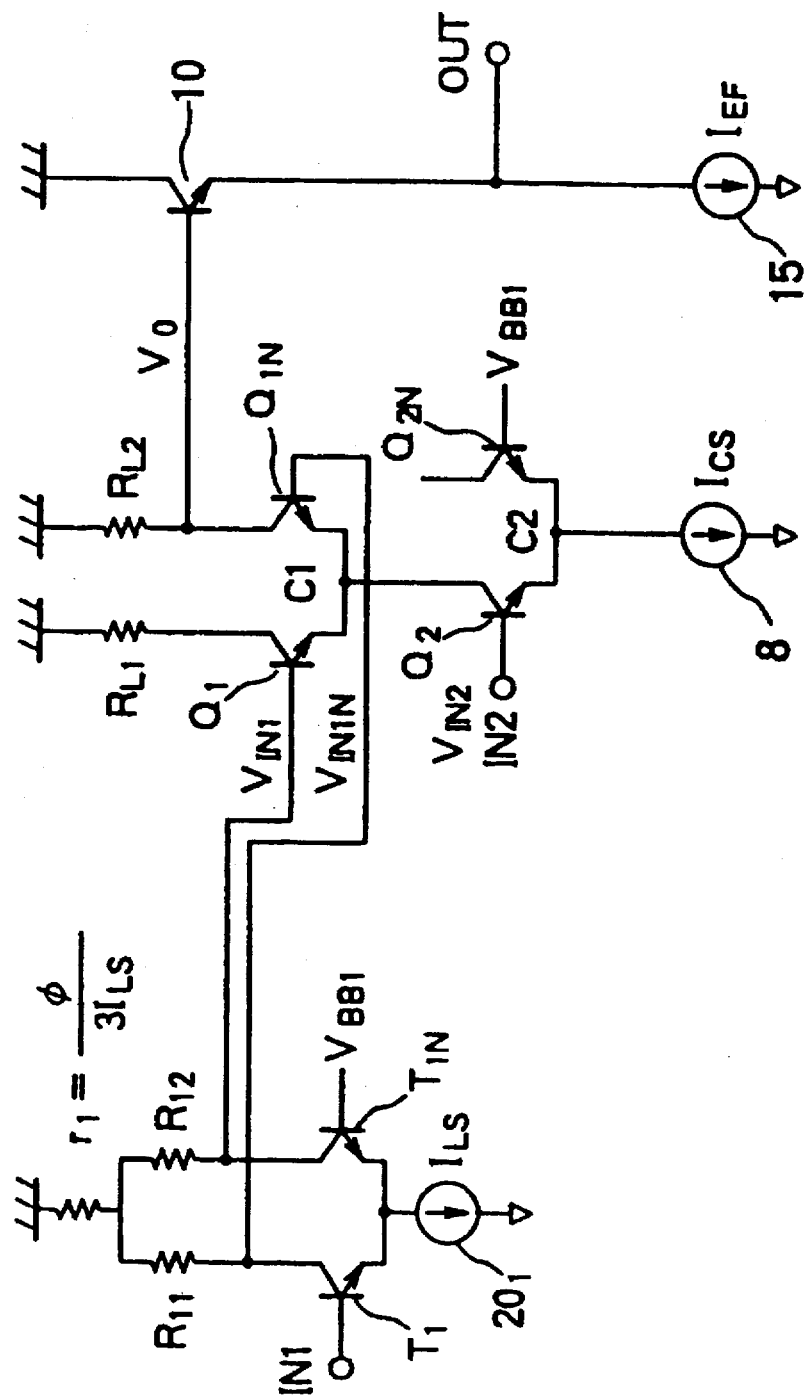
FIG. 15 is a circuit diagram showing a sixth embodiment of the semiconductor integrated circuit device according to the present invention.
Figure 16:
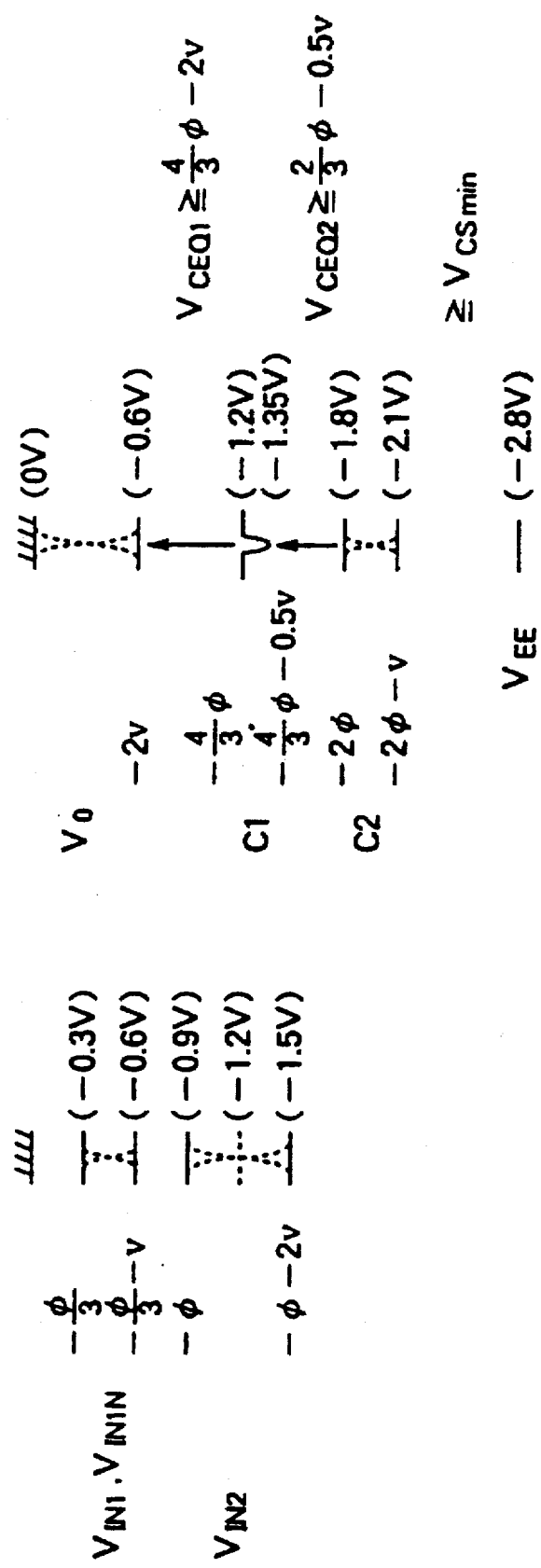
FIG. 16 is a typical diagram showing the potential levels at the respective nodes of the sixth embodiment thereof.

FIG. 15 shows a sixth embodiment of the semiconductor integrated circuit according to the present invention. This embodiment is a two-stage series-gating single ended ECG circuit operative by the same supply voltage as with the case of the fifth embodiment of the semiconductor integrated circuit device. The semiconductor integrated circuit of FIG. 15 is formed such that the lowermost stage single ended logic circuit and the second level shift circuit of the fifth embodiment are eliminated and further the resistance $r_1$ ($=\phi/3I_{LS}$) is connected to the first level shift circuit. FIG. 16 shows the typical potential levels at the respective nodes of the sixth embodiment shown in FIG. 15.

Further, in the above-mentioned embodiments, the case where the $\phi^*$ is reduced down to 0.5$\phi$ and $\delta=0$ has been explained by way of example. The values are not meant to be limited only thereto; it is of course possible to select various values of $\phi^*$ and $\delta$.

Figure 18:
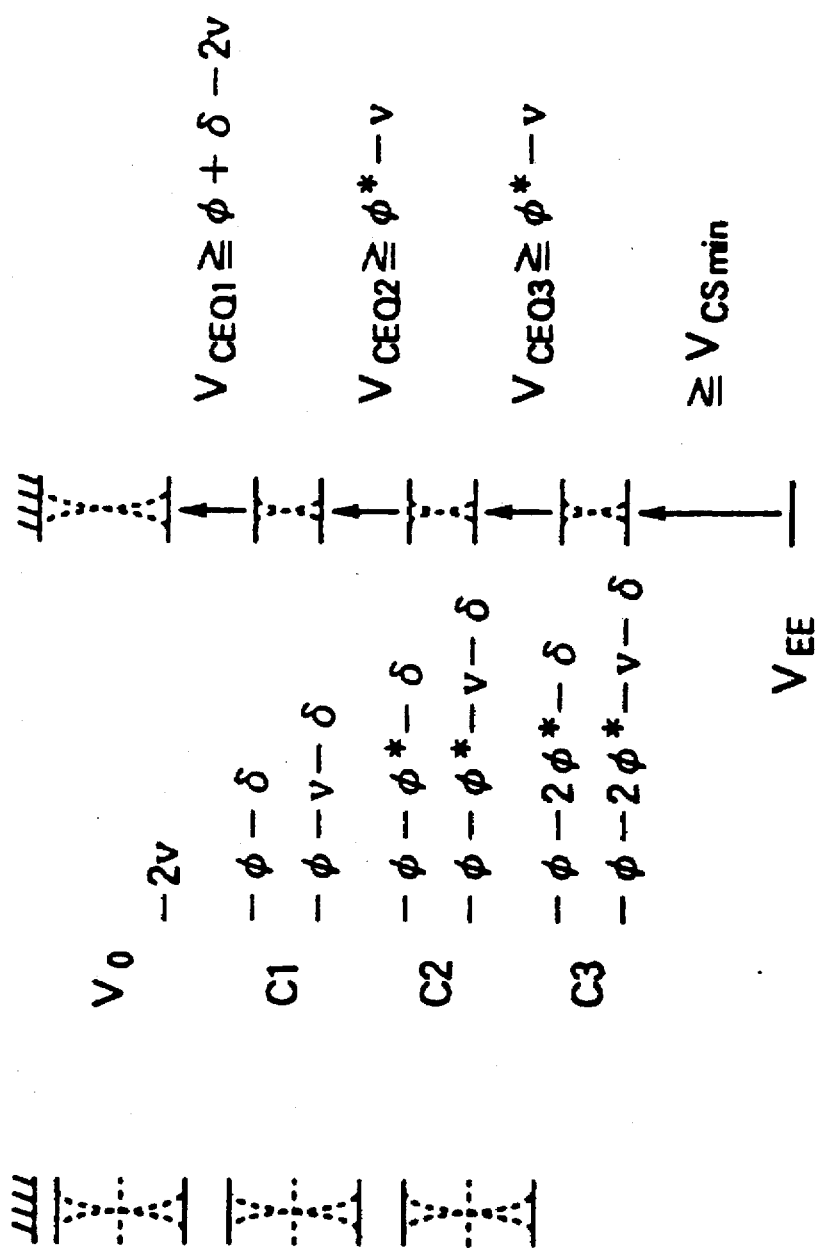
FIG. 18 is a typical diagram showing the potential levels at the respective nodes of the seventh embodiment thereof.

FIG. 17 shows a seventh embodiment of the semiconductor integrated circuit according to the present invention. FIG. 18 shows the typical potential levels at the respective nodes of the seventh embodiment shown in FIG. 17. The semiconductor integrated circuit in this embodiment is formed such that the respective stages of the logic circuits of the fourth embodiment of the semiconductor integrated circuit device shown in FIG. 11 are changed from the differential type to the single ended type. In more detail, in the i-th (i=1, 2 and 3) level shift circuit, the single ended signal of large amplitude is outputted as it is, without being converted into a differential signal. Therefore, the potential level of the third (lowermost) level shift circuit can be lowered, so that the transistor of the third level shift circuit is saturated. Therefore, the output of the third level shift circuit is formed by an emitter follower of a transistor $T_4$ to reduce the output level by $\phi$, before the output signal thereof is transmitted to the base of the transistor $Q_3$ of the lowermost stage logic circuit.

Further, in this seventh embodiment, when $r_1$, $r_2$, $r_3$ and $I_{LS}$ are so selected that the following formula can be established $$I_{LS}(r_2-r_1)=I_{LS}(r_3-r_2)+\phi=\phi^* \quad (7)$$

the signals whose levels are shifted by $\phi^*$ are inputted to the respective differential stage transistors. As a result, the voltages $V_{CE}$ applied to the respective stage transistors $Q_1$, $Q_2$, $Q_3$ or $Q_{1N}$, $Q_{2N}$, $Q_{3N}$ are $$V_{CEQ1}=2((\phi+\delta)/2-v),$$

where $$\delta=I_{LS}\cdot r_1$$

$$V_{CEQ2}=\phi^*-v$$

$$V_{CEQ3}=\phi^*-v \quad (8)$$

Therefore, it is possible to freely determine the operating point of each transistor by varying $\phi^*$ and $\delta$ until the transistor reaches a limit of the saturation range. In comparison with the formula (8) with the voltage $V_{CE}$ applied to the respective transistors in the conventional ECG shown in Table 1, it is understood that $\phi^*$ corresponds to a reduced $\phi$ from the circuit standpoint.

Here, the conditions that the respective differential stage transistors will not enter the saturation range can be obtained as $$\phi+\delta-2v \geq V_{CENS}$$

$$\phi^*-v \geq V_{CENS}$$

Further, when calculated on the assumption that $v=\phi/3$ and $V_{CENS}=3/\phi$, $$\delta \geq 0$$

$$\phi^* \geq 2\phi/3 \quad (9)$$

On the other hand, the conditions that the third level shift circuit will not be saturated can be obtained as $$\{(-2\phi^*-2v-\delta)+\phi\}-(-2\phi) \geq V_{CENS}$$

Therefore, $$\phi^* \leq 3\phi/2-(2v+\delta+V_{CENS})/2$$

Further, when calculated on the assumption that $v=\phi/3$ and $V_{CENS}=3/\phi$, $$\phi^* \leq \phi-\delta/2 \quad (10)$$

Further, the conditions that the second (intermediate) level shift circuit will not be saturated can be obtained as $$(-\phi^*-2v-\delta)-(-2\phi) \geq V_{CENS}$$

Therefore, $$\phi^* \leq 2\phi-(2v+\delta+V_{CENS})$$

Further, when calculated on the assumption that $v=\phi/3$ and $V_{CENS}=3/\phi$, $$\phi^* \leq \phi-\delta \quad (11)$$

Further, the allowable range of $\phi^*$ according to the formulae (9), (10) and (11) is $$2\phi/3 \leq \phi^* \leq \phi-\delta \quad (12)$$

so that it is possible to reduce $\phi$ one to 2/3 times from the circuit standpoint.

Here, the minimum operating voltage $V_{EEmin}$ of the ECG circuit of the seventh embodiment can be calculates as $$|V_{EEmin}|=2\phi^*+\phi+v+\delta+V_{CSmin} \quad (13)$$

Therefore, it is possible to reduce the voltage according to the reduction rate of $\phi$ as $$7\phi/3+v+V_{CSmin} \leq |V_{EEmin}| \leq 3\phi^*+v+V_{CSmin}$$

That is, the voltage can be reduced down to a range from 3.1 to 3.7 V.

Further, in the seventh embodiment, a predetermined reference voltage $V^*_{BBi}$ is applied to the base of the transistor $Q_{iN}$ of the i-th stage logic circuit of the differential logic circuit. Further, this reference voltage $V^*_{BBi}$ is determined so as to become an intermediate value of the amplitude of the potential $V_{1Ni}$ applied to the base of a pair of the differential transistors $Q_i$ of a pair of the transistors $Q_i$ and $Q_{iN}$.

Figures 19A, 19B, 19C:
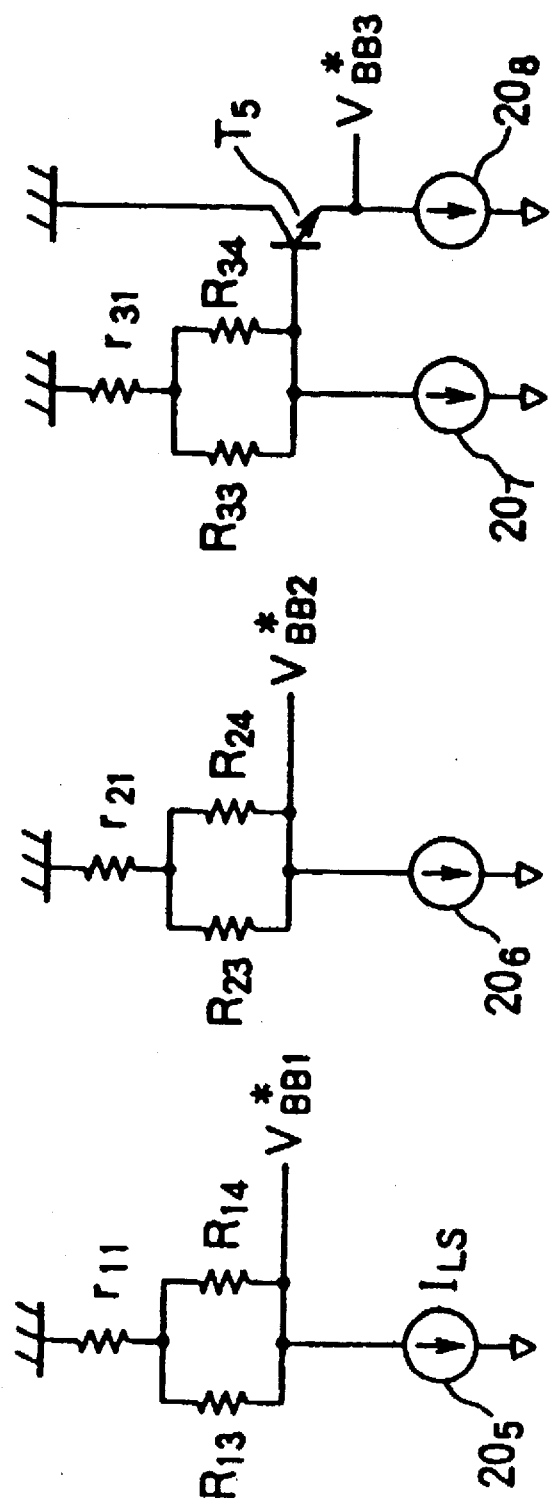
FIGS. 19A to 19C are circuit diagrams showing three reference voltage generating circuits related to the seventh embodiment, respectively.

These reference potentials $V^*_{BB1}$, $V^*_{BB2}$ and $V^*_{BB3}$ can be respectively generated by the circuits as shown in FIGS. 19A, 19B and 19C, for instance. In the reference potential generating circuit shown in FIG. 19A, one end of a resistor $r_{11}$ is grounded; the other end of this resistor $r_{11}$ is connected to one end of a pair of parallel-connected resistors $R_{13}$ and $R_{14}$; the other end of this parallel circuit is connected to a supply voltage via a constant current source $20_5$. Further, an output reference voltage $V^*_{BB1}$ is taken out of the other end of the parallel circuit.

In the reference potential generating circuit shown in FIG. 19B, one end of a resistor $r_{21}$ is grounded; the other end of this resistor $r_{21}$ is connected to one end of a pair of parallel-connected resistors $R_{23}$ and $R_{24}$; the other end of this parallel circuit is connected to a supply voltage via a constant current source $20_6$. Further, an output reference voltage $V^*_{BB2}$ is taken out of the other end of the parallel circuit.

Further, in the reference potential generating circuit shown in FIG. 19C, an emitter follower of a transistor $T_5$ is additionally connected to the circuit shown in FIG. 19A or 19B, in order to further shift the output of the parallel circuit by $\phi$ to output an output reference voltage $V^*_{BB3}$.

Figure 20:
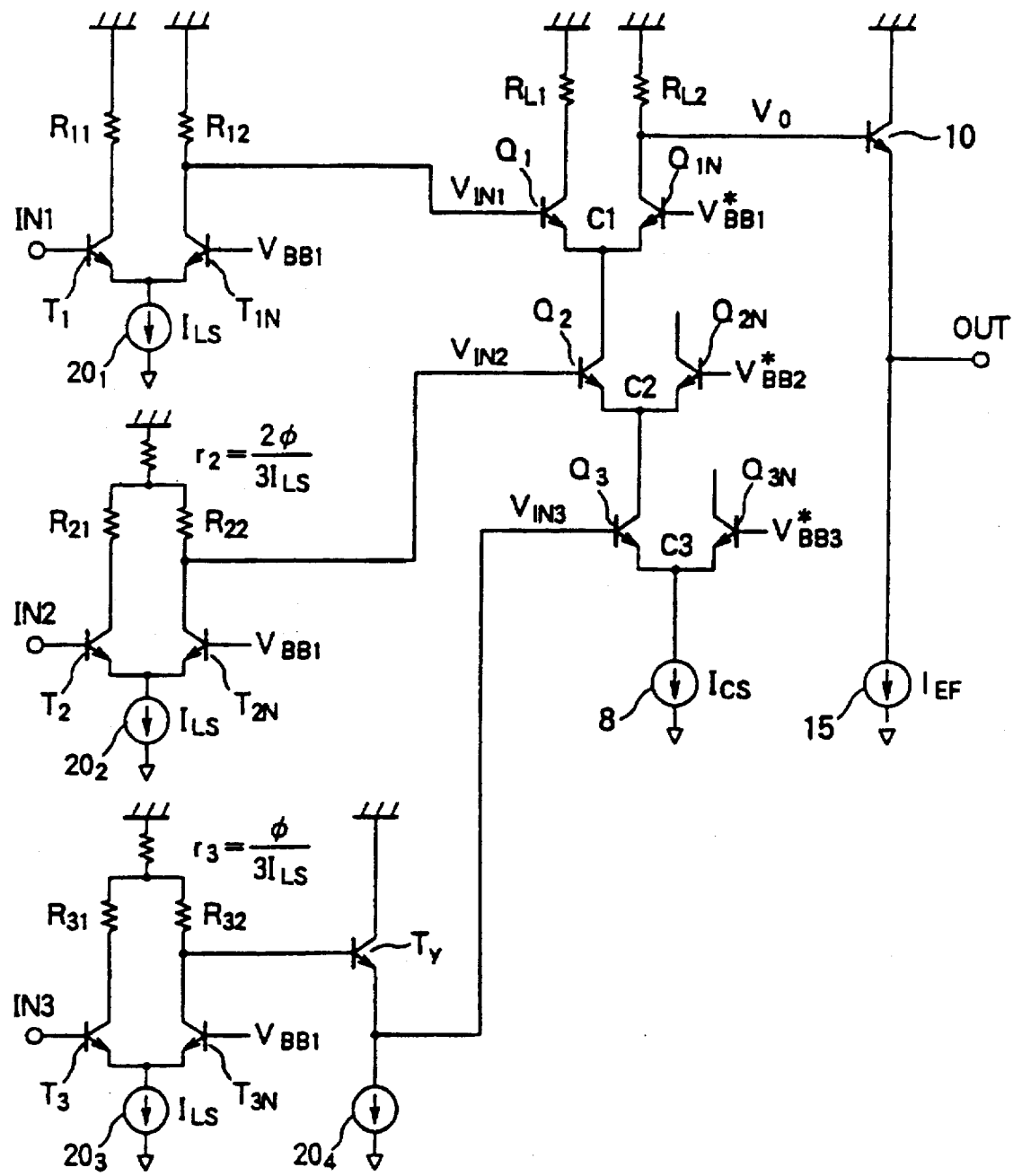
FIG. 20 is a circuit diagram showing an eighth embodiment of the semiconductor integrated circuit device according to the present invention.
Figure 21:
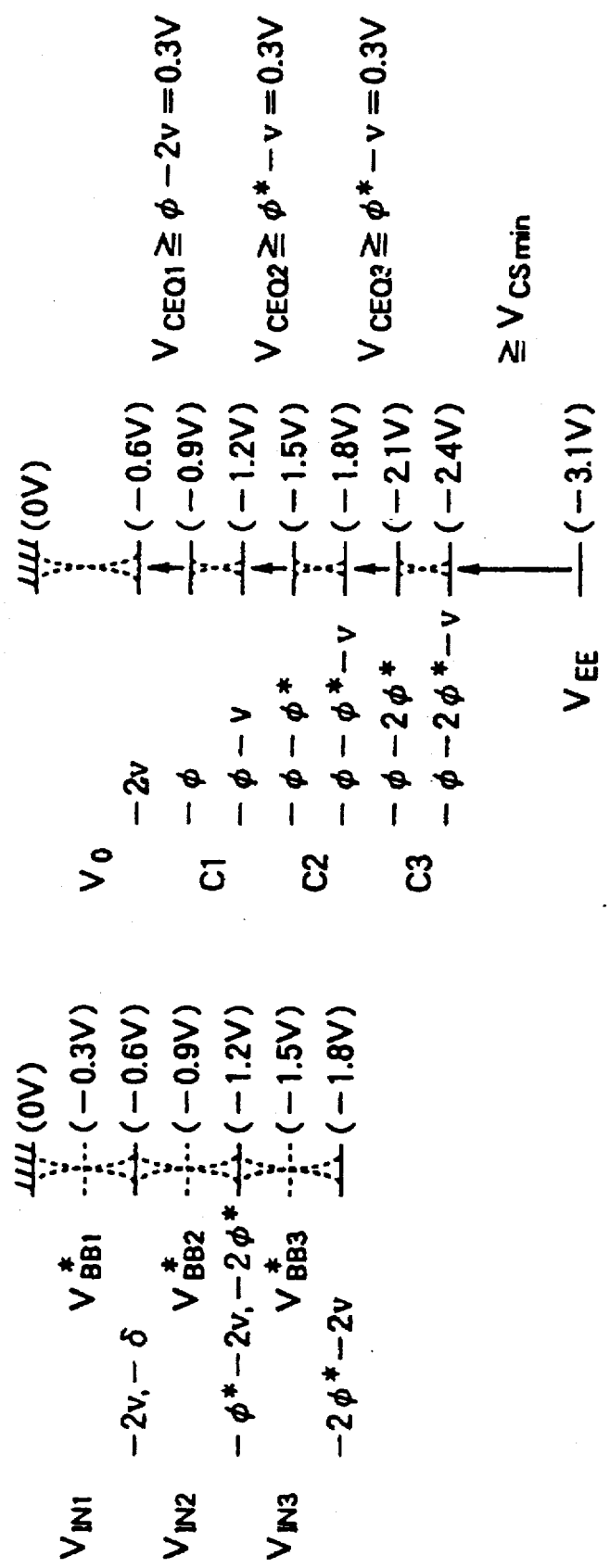
FIG. 21 is a typical diagram showing the potential levels at the respective nodes of the eighth embodiment thereof.

FIG. 20 shows an eighth embodiment of the semiconductor integrated circuit according to the present invention. The semiconductor integrated circuit in this embodiment is formed such that $\phi$ is reduced down to $\phi^*=2\phi/3$ (=0.6 V); $\delta=0$; $r_1=0$; $r_2=2\phi/3I_{LS}$; and $r_3=\phi/3I_{LS}$ in the seventh embodiment shown in FIG. 17. FIG. 21 shows the typical potential levels at the respective nodes of the eighth embodiment shown in FIG. 20. The absolute value of the minimum operating voltage $V_{EEmin}$ of this eighth embodiment of the semiconductor integrated circuit device can be obtained in accordance with the formula (13) as follows:

$$|V_{EEmin}|=7\phi/3+v+V_{CSmin}=3.1 \text{ V}$$

Therefore, it is possible to operate the three-stage series-gating single ended ECL circuit at the minimum supply voltage (about 3.1 V), which is roughly an intermediate value of the supply voltages of the conventional two-stage series-gating ECL circuit and the conventional single-stage series-gating ECL circuit.

Figure 22:
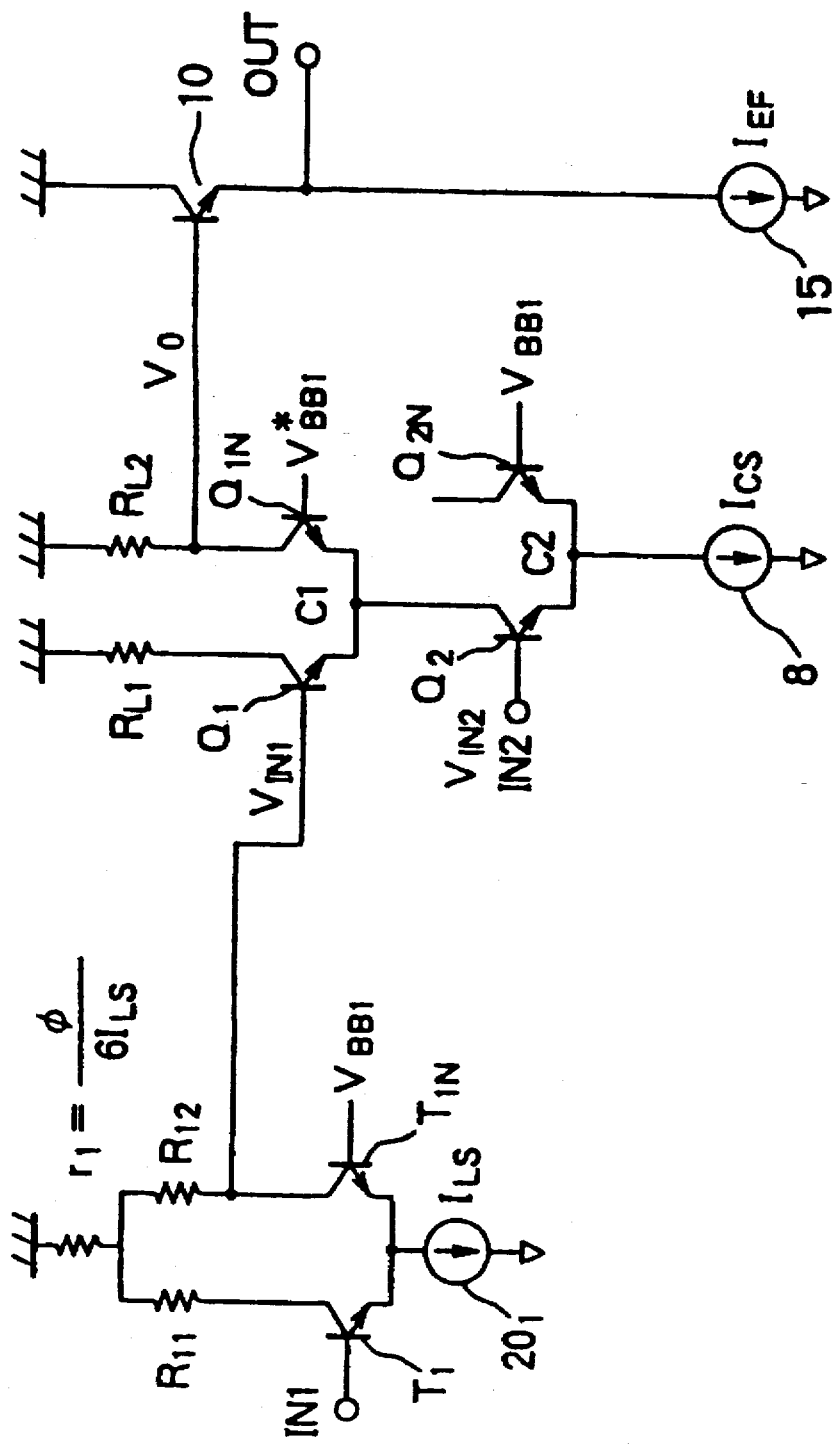
FIG. 22 is a circuit diagram showing an ninth embodiment of the semiconductor integrated circuit device according to the present invention.
Figure 23:
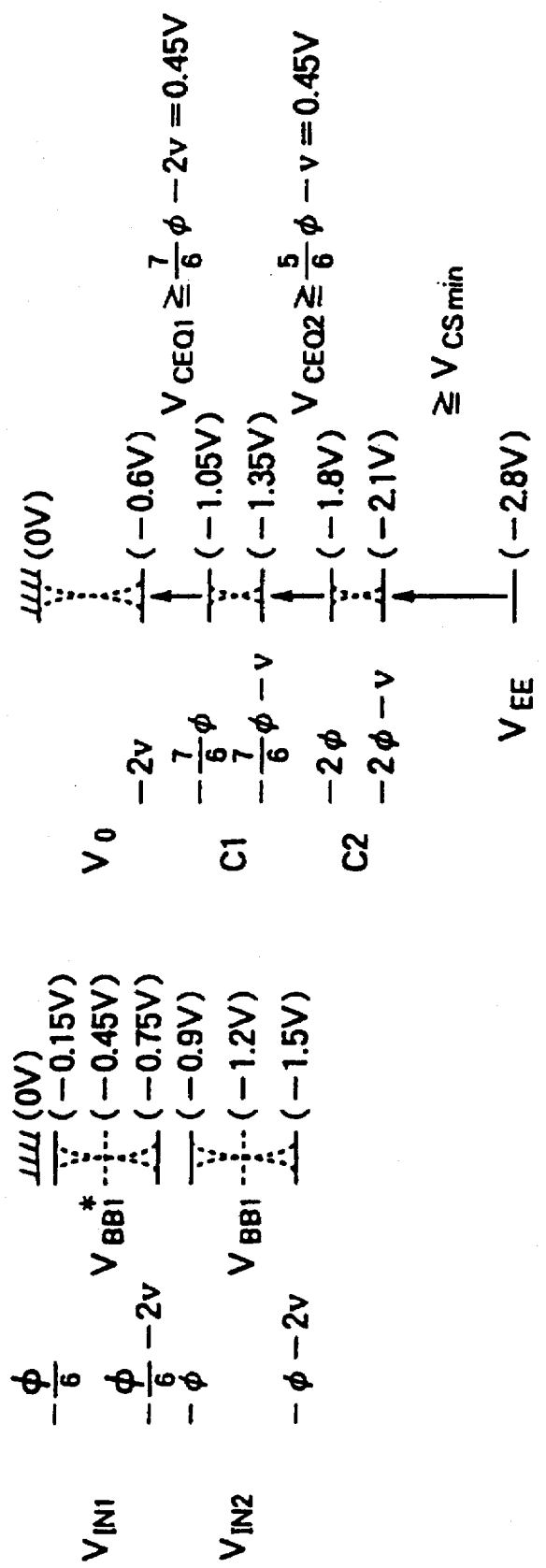
FIG. 23 is a typical diagram showing the potential levels of the respective nodes of the ninth embodiment thereof.

FIG. 22 shows a ninth embodiment of the semiconductor integrated circuit according to the present invention. The semiconductor integrated circuit in this embodiment is formed such that the three-stage circuit is reduced to the two-stage circuit; the second and third level shift circuits are eliminated; and a resistor $r_1$ ($=\phi/6I_{LS}$) is added to the first level shift circuit in the eighth embodiment shown in FIG. 20. FIG. 23 shows the typical potential levels at the respective nodes of the ninth embodiment shown in FIG. 22. The absolute value of the minimum operating voltage $V_{EEmin}$ of this ninth embodiment of the semiconductor integrated circuit device is the higher value of either of $(2\phi+v+V_{CSmin})$ and $(\phi^*+\phi+v+\delta+V_{CSmin})$, because this voltage cannot be reduced lower than the minimum operating voltage of the single-stage level shift circuit (Table 2).

Now, if $\phi^* \leq \phi-\delta$, the minimum operating voltage $V_{EEmin}$ can be expressed as $$|V_{EEmin}|=2\phi+v+V_{CSmin} \quad (14)$$

Therefore, the reduction of $(2\phi/3 \leq \phi^* \leq \phi-\delta)$ does not contributes to the reduction of the voltage $|V_{EEmin}|$, but contributes to only a reduction of voltage by increasing the level of $V_{1n1}$.

In the ninth embodiment, it is possible to operate the two-stage series-gating single ended ECG circuit at the minimum supply voltage (about 2.8 V), which is the same as with the case of the conventional single-stage single ended ECG circuit.

Figure 24:
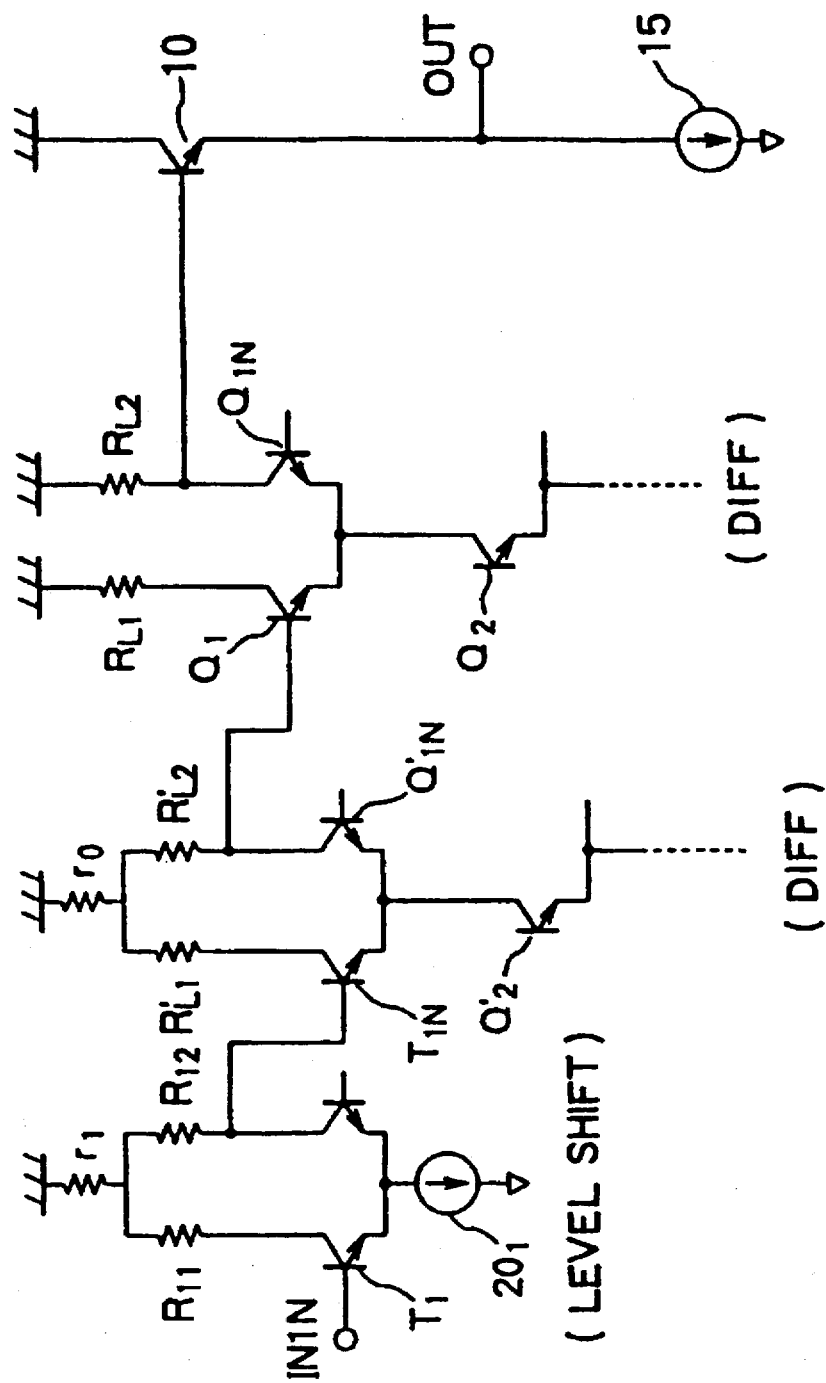
FIG. 24 is a circuit diagram showing a tenth embodiment of the semiconductor integrated circuit device according to the present invention.

FIG. 24 shows a tenth embodiment of the semiconductor integrated circuit according to the present invention. In this embodiment of the semiconductor integrated circuit device, a plurality (two in FIG. 24) of differential logic circuits (referred to as differential stages) are connected in cascade. Further, a resistor $r_0$ is connected to the differential stage, except that the final-stage differential circuit is directly connected to an emitter follower output circuit 10, so that the input levels of the respective differential stages can be equalized to the input signal level of the uppermost differential stage.

FIGS. 25A to 25F show an eleventh embodiment of the semiconductor integrated circuit according to the present invention. In this embodiment, as shown in FIG. 25A, a four-input multiplexer is formed by a three-stage series-grating differential ECL circuit. This four-input multiplexer selects one of four input signals A0, A1, A2 and A3 on the basis of two select control signals S0 and S1 (inversion signals of S0N and S1N). Further, the four input signals A0, A1, A2 and A3 are all level-shifted to signals A0I, A1I, A2I and A3I by four level shift circuits as shown in FIGS. 25B, 25C, 25D and 25E, respectively. Further, the select control signal S0 is also level-shifted to a signal S0I by a level shift circuit as shown in FIG. 25F.

FIGS. 26A to 26F show a twelfth embodiment of the semiconductor integrated circuit according to the present invention. The semiconductor integrated circuit in this embodiment is formed such that the level shift circuits for level-shifting the four input signals A0, A1, A2 and A3 and the select control signal S0 of the embodiment shown in FIG. 25A are changed from the differential type to the single ended type, respectively. In addition, the logic circuit for inputting the select control signal S1 is changed from the differential type to the single ended type.

Figure 27A:
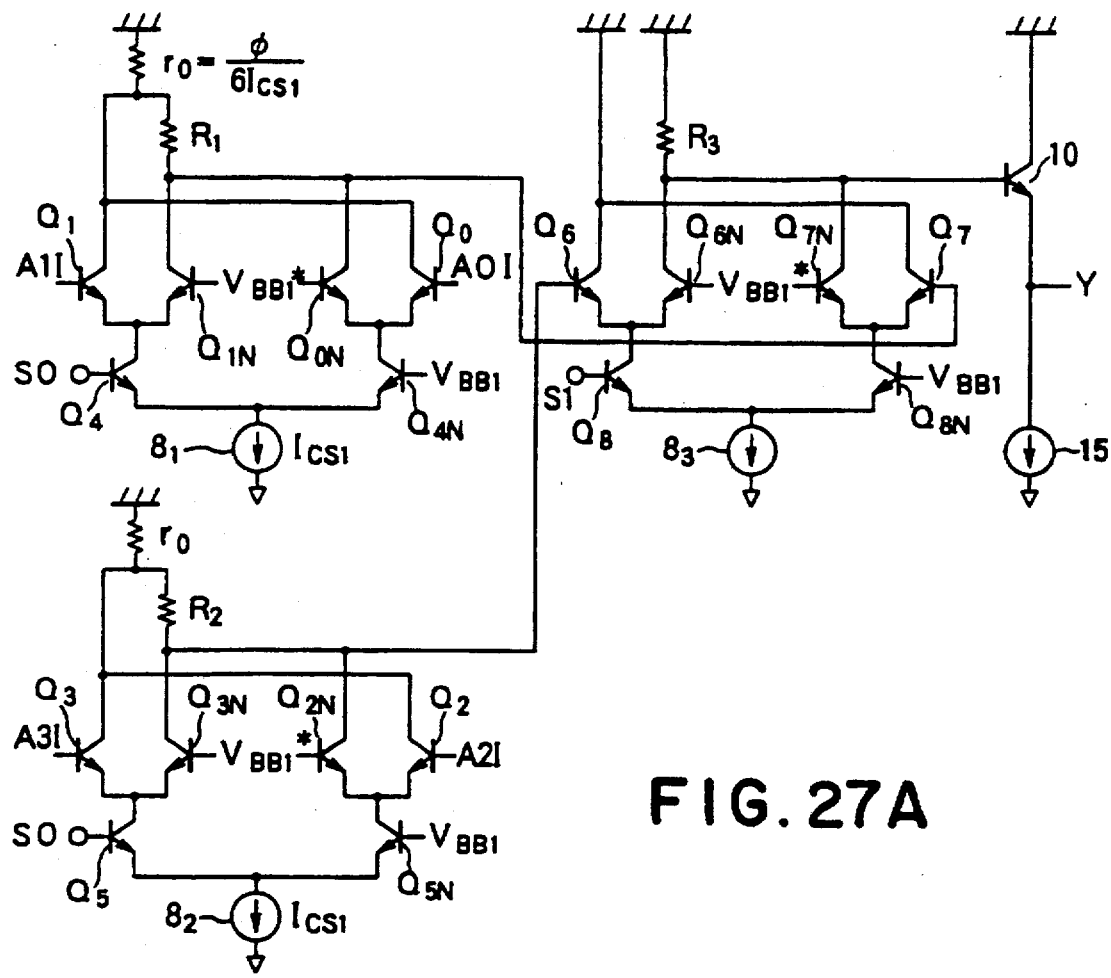
FIGS. 27A to 27E are is circuit diagrams showing a thirteenth embodiment of the semiconductor integrated circuit device according to the present invention.
Figures 27B, 27C, 27D, 27E:
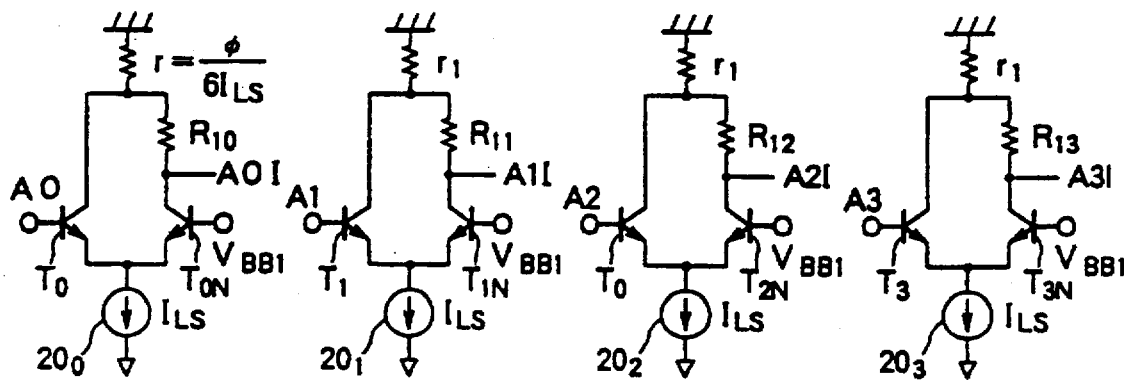

FIGS. 27A to 27E show a thirteenth embodiment of the semiconductor integrated circuit according to the present invention. In this embodiment, as shown in FIG. 27A, a four-input multiplexer is formed by a two-stage series-gating single ended ECL circuit.

Figure 28A:
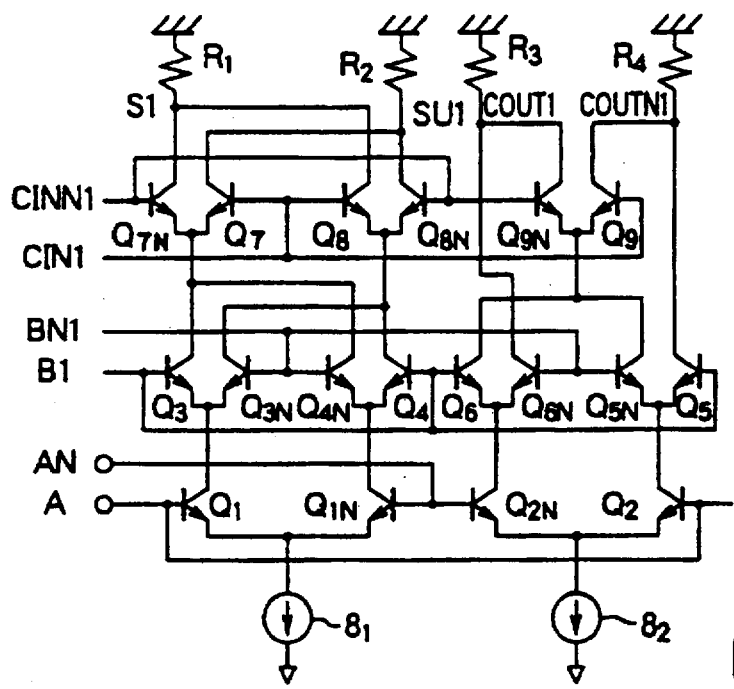
FIGS. 28A to 28G are circuit diagrams showing a fourteenth embodiment of the semiconductor integrated circuit device according to the present invention.
Figure 28B:
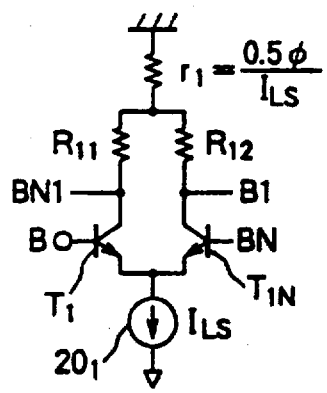
Figure 28C:
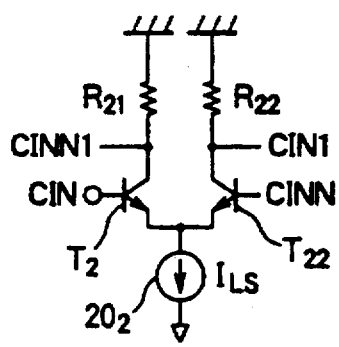
Figure 28D:
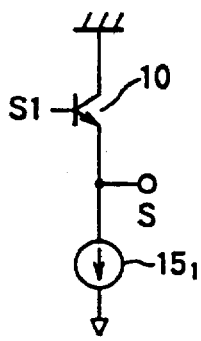
Figure 28E:
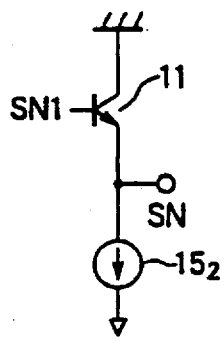
Figure 28F:
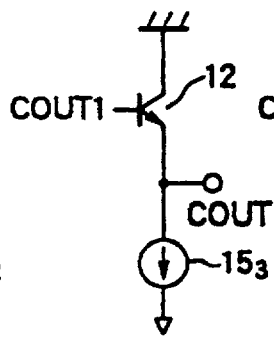
Figure 28G:
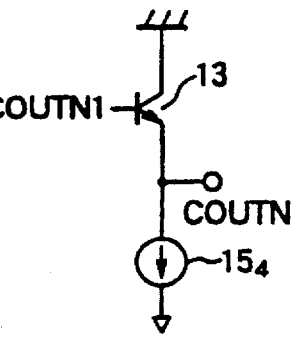

FIGS. 28A to 28G show a fourteenth embodiment of the semiconductor integrated circuit according to the present invention. In the circuit device of this embodiment, as shown in FIG. 28A, an adder is formed by a three-stage series-gating differential ECL circuit. The adder adds two input signals A and B and a carry input signal CIN. The input signal B and the carry input signal CIN are level-shifted to signals B1 and CIN1 by two level shift circuits as shown in FIGS. 28B and 28C, respectively. These level-shifted signals are inputted to the adder as shown in FIG. 28A. The adder outputs an addition signal S1 and an inversion signal S1N thereof and a carry signal COUT1 (indicative of the presence or absence of a carry) and an inversion signal COUTN1 thereof, as an addition result. These signals are transmitted to four emitter follower output circuits as shown in FIGS. 28D, 28E, 28F and 28G, respectively. These output circuits output the output signals S, SN, COUT and COUTN, respectively.

Figure 29A:
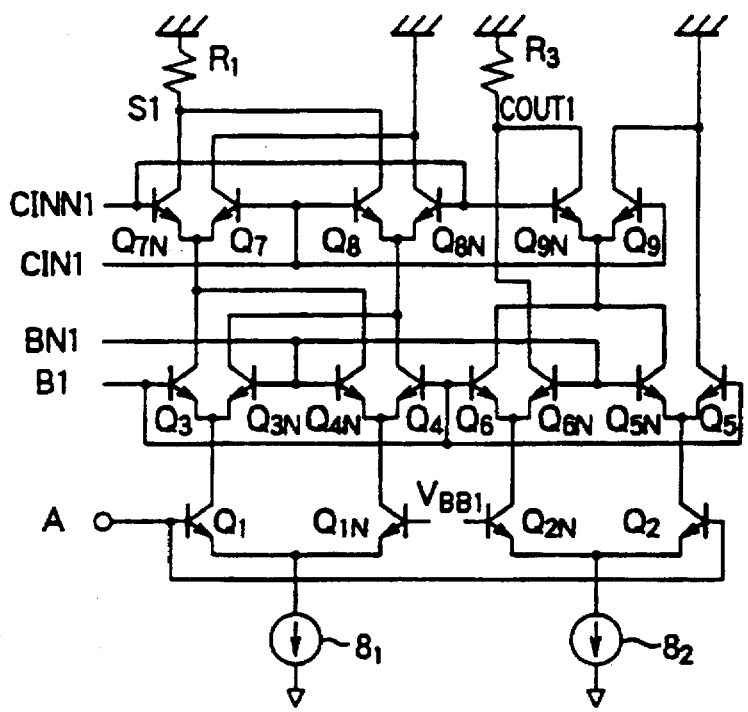
FIGS. 29A to 29E are circuit diagrams showing a fifteenth embodiment of the semiconductor integrated circuit device according to the present invention.
Figure 29B:
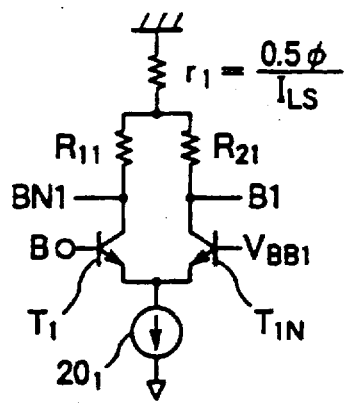
Figure 29C:
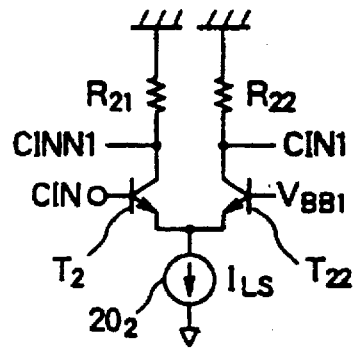
Figure 29D:
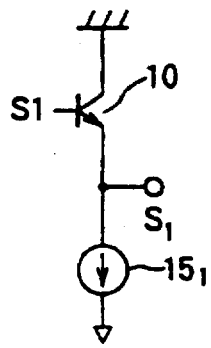
Figure 29E:
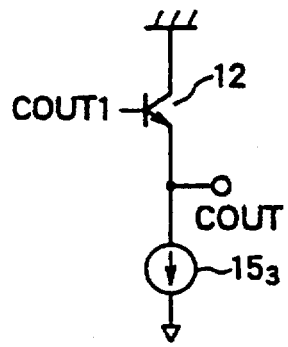

FIGS. 29A to 29E show a fifteenth embodiment of the semiconductor integrated circuit according to the present invention. The semiconductor integrated circuit in this embodiment is formed such that the level shift circuits of the adder as shown in FIG. 28A are changed from the differential type as shown in FIGS. 28B and 28C to the single ended type as shown in FIGS. 29B and 29C, respectively. Further, the semiconductor integrated circuit in this embodiment is formed such that the logic circuit of FIG. 28A for inputting the input signal A is changed from the differential type to the single ended type. The adder outputs an addition signal S1 and a carry single COUT1 to the emitter follower output circuits as shown in FIGS. 29D and 29E. These output circuits output the output signals S1 and COUT1, respectively.

Figure 30A:
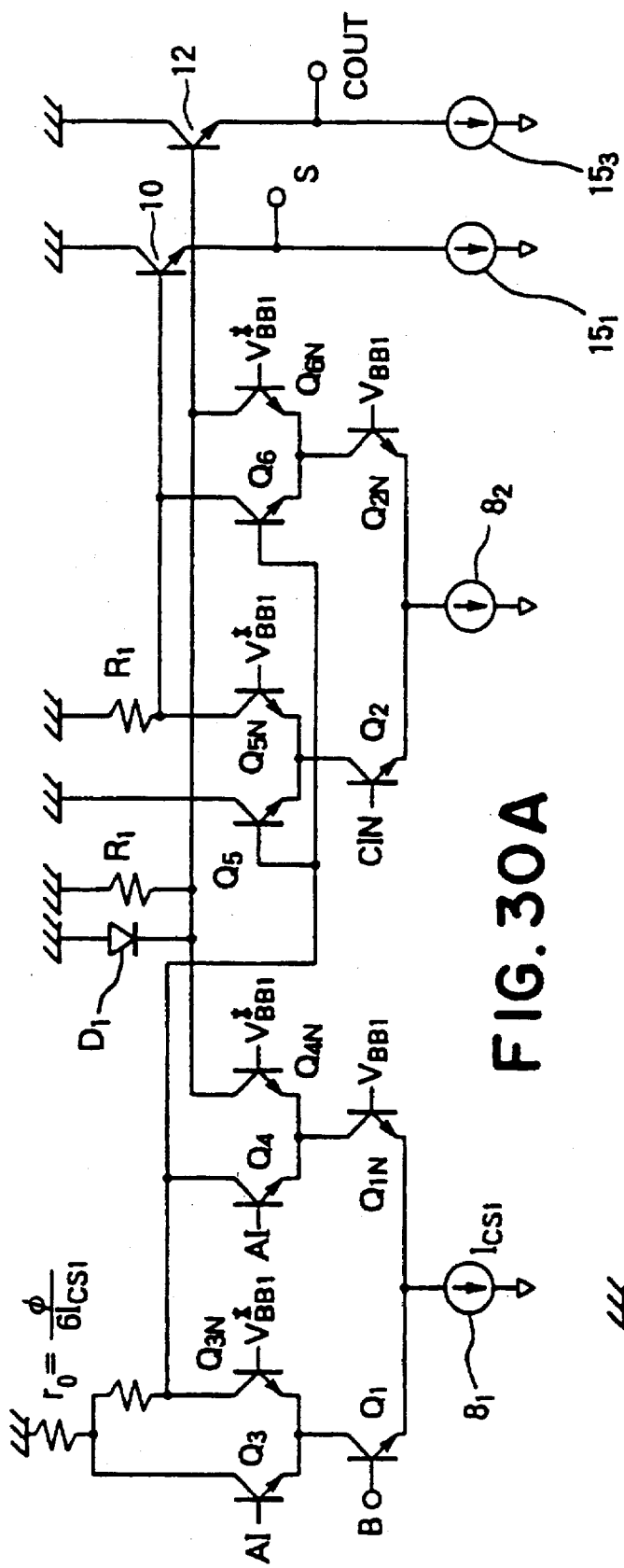
FIGS. 30A and 30B are is circuit diagrams showing a sixteenth embodiment of the semiconductor integrated circuit device according to the present invention.
Figure 30B:
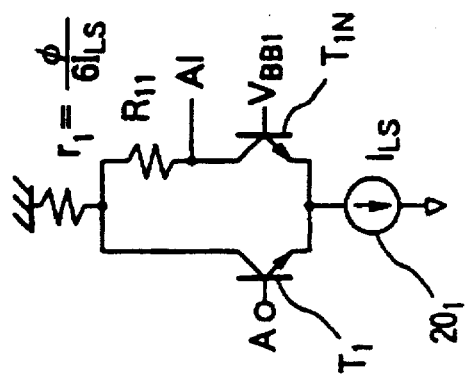

FIGS. 30A and 30B show a sixteenth embodiment of the semiconductor integrated circuit according to the present invention. In this embodiment, as shown in FIG. 30A, an adder is formed by a two-stage series-gating single ended ECG circuit.

In the first to sixteenth embodiments, the current sources 8, $8_1$ and $8_2$, 15, $15_1$ to $15_4$ and $20_0$ to $20_4$ are not necessarily constant current sources. The current sources may be a conventional current source circuit (not constant) or a resistor.

Here, the minimum operating voltage, the operating speed and the power consumption of the four-input multiplexer of the eleventh and thirteenth embodiments as shown in FIGS. 25A to 25F and 27A to 27E have been calculated by the circuit simulator SPICE (made at the university of California, Berkeley), and listed in Tables 3, 4 and 5 below, in comparison with the prior art four-input multiplexer.

TABLE 3

| (Minimum operating voltage $|V_{EEmin}|$) | | |
|---|---|---|
| | INVENTION | PRIOR ART |
| 3-STAGE SER-GATE DIFF | 2.5V | 4.2V |
| 2-STAGE SER-GATE SIN ENDED | 2.8V | 3.6V |

TABLE 4

| (Operating speed) | | | |
|---|---|---|---|
| | | INVENTION | PRIOR ART |
| 3-STAGE SER -GATE DIFF | A0 → Y | 210 ps / 250 ps | 150 ps / 180 ps |
| | S0 → Y | 260 ps / 300 ps | 200 ps / 240 ps |
| | S1 → Y | 210 ps / 260 ps | 240 ps / 290 ps |
| 2-STAGE SER -GATE SINGLE ENDED | A0 → Y | 390 ps / 460 ps | 290 ps / 350 ps |
| | S0 → Y | 330 ps / 410 ps | 350 ps / 400 ps |
| | S1 → Y | 230 ps / 290 ps | 230 ps / 290 ps |

$V_{EE} = \$V_{EEmin}\$$; $C_L = 200$ p; $I_{CS} = I_{EF} = 280$ μA

TABLE 5

| (Minimum power consumption) | | |
|---|---|---|
| | INVENTION | PRIOR ART |
| 3-STAGE DIFF | 5.7 mW / gate | 8.4 mW /gate |
| 2-STAGE SINGLE ENDED | 6.4 mW / gate | 8.2 mW /gate |

Further, the Item (A0→Y) in Table 4 indicates that the time from when the input signal A0 is changed from "L" to "H" to when the changed input signal A0 is outputted to the output terminal Y is 210 ps (picoseconds) in the case of the invention and 150 ps in the case of the prior art, and the time from when the input signal A0 is changed from "H" to "L" to when the changed input signal A0 is outputted to the output terminal Y is 250 ps in the case of the invention and 180 ps in the case of the prior art, on condition that the select control signals S0 and S1 are kept constant and further the input terminal for inputting the input signal A0 is connected to the output terminal Y of the multiplexer.

Further, the Item (S0→Y) in Table 4 indicates that the time from when the select control signal S0 is changed from "L" to "H" to when the influence thereof is outputted to the output terminal Y is 260 ps in the case of the invention and 200 ps in the case of the prior art, and the time from when the control signal S0 is changed from "H" to "L" to when the influence thereof is outputted to the output terminal Y is 300 ps in the case of the invention and 240 ps in the case of the prior art, on condition that the select control signal S1 is kept constant and further the output terminal Y of the multiplexer is switched from the input signal A0 to the input signal A1, for instance when the select control signal S0 is switched from "L" to "H". Further, the same is applied to the Item S1→Y.

Table 4 indicates that although the operating speed of the present invention is lower than that of the prior art, the difference between (L→H) and (H→L) in the delay time of the critical path of the invention is smaller than that of the prior art, as listed in Table 6 below.

TABLE 6

| | INVENTION | PRIOR ART |
|---|---|---|
| 3-STAGE DIFF | 260 ps / 300 ps | 240 ps / 290 ps |
| 2-STAGE SINGLE ENDED | 390 ps / 460 ps | 350 ps / 400 ps |

Further, on the other hand, Tables 3 and 5 indicate that the operating supply voltage can be reduced markedly and further the power consumption can be also suppressed. Further, since the operating voltage can be reduced down to 3.3 V or 2.5 V, it is possible to form the ECG circuit on the same board or the same chip on which microminiaturized CMOSs are formed, so as to be operative under a single supply voltage.

In summary, in the semiconductor integrated circuit device according to the present invention, it is possible to form the semiconductor integrated circuit device operative on a lower supply voltage, without significantly degrading the functions and performance thereof.

On the contrary, if the operating voltage of the prior art, such as 4.2 V is in use, in the semiconductor integrated circuit device according to the present invention, it is possible to form the semiconductor integrated circuit device with more stages. This can be understood from Table 3.

What is claimed is:

1. A semiconductor integrated circuit device comprising:
    a differential logic circuit formed by multi-stage series-gating logic circuits each composed of a plurality of bipolar transistors whose emitters are connected in common, each of the bipolar transistors having a base; and
    a plurality of level shift circuits, each level shift circuit for shifting a level of an input signal that is inputted from the outside in correspondence to one of the stage logic circuits of said differential logic circuit, and for supplying the level-shifted input signal to the base of one of the bipolar transistors of the corresponding stage logic circuit, wherein a potential difference between level-shifted signals inputted to the bases of the bipolar transistors of any two adjacent stage logic circuits of the multi-stage series-gating logic circuits is determined, as a level shift rate, to be lower than a built-in potential between the base and emitter of each of the bipolar transistors thereof.

2. The semiconductor integrated circuit of claim 1, wherein one of the level shift circuits is provided for each of the stage logic circuits of the multi-stage series-gating logic circuits.

3. The semiconductor integrated circuit of claim 1, wherein the logic circuits of said differential logic circuit are of a differential type, and said level shift circuits are composed of differential current mode logic gates.

4. The semiconductor integrated circuit of claim 1, wherein the logic circuits of said differential logic circuit are of single ended type, and said level shift circuits are composed of single ended current mode logic gates.

5. The semiconductor integrated circuit of claim 1, wherein the logic circuits of said differential logic circuit are of a differential type, and said level shift circuits are composed of single ended current mode logic gates.

6. A semiconductor integrated circuit device comprising:

a differential logic circuit formed by multi-stage series-gating logic circuits each composed of a plurality of bipolar transistors whose emitters are connected in common, a first specific stage logic circuit, among the multi-stage series-gating logic circuits, being connected to a current source and a second specific stage logic circuit, among the multi-stage series-gating logic circuits, being connected to at least one load resistor; and a plurality of level shift circuits, each level shift circuit for shifting a level of an input signal that is inputted from the outside in correspondence to one of the stage logic circuits of said differential logic circuit, and for supplying the level-shifted input signal to a base of one of the bipolar transistors of the corresponding stage logic circuit, one of the level shift circuits being provided for each of the stage logic circuits except the first specific stage logic circuit, wherein a potential difference between level-shifted signals inputted to the bases of the bipolar transistors of any two adjacent stage logic circuits of the multi-stage series-gating logic circuits is determined, as a level shift rate, to be lower than a built-in potential between the base and emitter of each of the bipolar transistors thereof.

7. The semiconductor integrated circuit of claim 6, wherein the logic circuits of said differential logic circuit are of a differential type, and said level shift circuits are composed of single ended current mode logic gates.

8. The semiconductor integrated circuit of claim 6, wherein the logic circuits of said differential logic circuit are of single ended type, and said level shift circuits are composed of single ended current mode logic gates.

9. The semiconductor integrated circuit of claim 6, wherein the logic circuits of said differential logic circuit are of a differential type, and said level shift circuits are composed of differential current mode logic gates.

10. A semiconductor integrated circuit device comprising:

first to n-th ($n \geq 2$) differential logic circuits, each of the differential logic circuits being formed by multi-stage series-gating logic circuits each composed of a plurality of bipolar transistors whose emitters are connected in common, a first specific stage logic circuit, among the multi-stage series-gating logic circuits, being connected to a current source and a second specific stage logic circuit, among the multi-stage series-gating logic circuits, being connected to at least one load resistor; and a plurality of level shift circuits, each level shift circuit for shifting a level of an input signal that is inputted from the outside in correspondence to one of the stage logic circuits of said first differential logic circuit, and for supplying the level-shifted input signal to a base of one of the bipolar transistors of the corresponding stage logic circuit;

wherein a potential difference between level-shifted signals inputted to the bases of the bipolar transistors of any two adjacent stage logic circuits of the multi-stage series-gating logic circuits of said first differential logic circuit is determined, as a level shift rate, to be lower than a built-in potential between the base and emitter of each of the bipolar transistors thereof; and said first to n-th differential logic circuits are connected in cascade at n-stages.

11. The semiconductor integrated circuit of claim 10, wherein one of the level shift circuits is provided for each of the stage logic circuits of said first differential logic circuit.

12. The semiconductor integrated circuit of claim 10, wherein a resistor is connected between the load resistor and a power supply for each of said first to (n−1)-th differential logic circuits so that the input levels of the second to n-th differential logic circuits are equalized to the input level of the first differential logic circuit.

13. The semiconductor integrated circuit of claim 12, wherein one of the level shift circuits is provided for each of the stage logic circuits of said first differential logic circuit.

* * * * *